US00RE36644E

United States Patent [19]

Dennison

[11] E Patent Number: Re. 36,644

[45] **Reissued Date of Patent: *Apr. 4, 2000**

[54] TAPERED VIA, STRUCTURES MADE THEREWITH, AND METHODS OF PRODUCING SAME

[75] Inventor: Charles H. Dennison, Meridian, Id.

[73] Assignee: Micron Technology, Inc., Boise, Id.

[ * ] Notice: This patent is subject to a terminal disclaimer.

[21] Appl. No.: 08/745,757

[22] Filed: Nov. 8, 1996

Related U.S. Patent Documents

Reissue of:

[64] Patent No.: 5,362,666
Issued: Nov. 8, 1994
Appl. No.: 08/213,381
Filed: Mar. 15, 1994

U.S. Applications:

[63] Continuation of application No. 07/947,136, Sep. 18, 1992, abandoned.

[51] Int. Cl.[7] ..... H01L 21/20

[52] U.S. Cl. ..... 438/396; 438/397; 438/253; 438/254

[58] Field of Search ..... 437/47, 52, 60, 437/919; 148/DIG. 14; 438/396, 397, 399, 253, 254, 256, 239

[56] References Cited

U.S. PATENT DOCUMENTS 4,543,707 10/1985 Ito et al. .
5,061,651 10/1991 Ino .
5,077,238 12/1991 Fuji et al. .
5,135,881 8/1992 Saelci .
5,150,276 9/1992 Gonzales .

FOREIGN PATENT DOCUMENTS 0253661 10/1988 Japan .
0275665 11/1990 Japan .

OTHER PUBLICATIONS

Kawamoto et al., "A 1.28 μm Bit–Line Shielded Memory Cell Technology for 64 Mb DRAM", Symposium on VLSI technology, pp. 13–14, 1990.

Itoh et al., "Two Step Deposited Rugged Surface (TDRS) Storagenode and Self Aligned Bitline–Contact Penetrating Cellplate (SABPEC) for 64 MbDRAM STC Cell" IEEE Symposium on VLSI Technology, pp. 9–10, 1991.

Shibata et al., "A Novel Zero–Overlap/Enclosure Metal Interconnection Technology for High Density Logic VLSI's", IEEE VMIC Conference, pp. 15–21, 1990.

*Primary Examiner*—Tuan H. Nguyen
*Attorney, Agent, or Firm*—Trask, Britt & Rossa

[57] ABSTRACT

After formation of the storage poly in a stacked capacitor DRAM, the oxide 1 layer is partially etched to leave a thick oxide deposition in the area of the future bit line contact, upon which the cell poly is deposited, followed by oxide 2 and then a poly or nitride layer. A mask and etch process forms the bit line contact region through the cell poly, then a thin oxide is deposited and etched along with the oxide 1 to form cell poly spacers that don't close off the active area. The poly or nitride on top of the oxide 2 forms a hard mask that allows the spacers to travel down the side walls of the contact region creating a contact region that is wider at the top than bottom, facilitating metalization.

41 Claims, 14 Drawing Sheets

38
32
32
54
16
31
32
41
52
29A
47
50
46
48
42
36
30
29B
54
32
10
11

38
32
54
16
31
41
46
47
50
52
48
42
30
29A
29B
36
10
11

38
58
58
32
30
12
16
52
50
30
92
58
52
94
36
58
52
50
30
19
12

TAPERED VIA, STRUCTURES MADE THEREWITH, AND METHODS OF PRODUCING SAME

Matter enclosed in heavy brackets [ ] appears in the original patent but forms no part of this reissue specification; matter printed in italics indicates the additions made by reissue.

This is a continuation of copending application Ser. No. 07/947,136 filed on Sep. 18, 1992, now abandoned.

BACKGROUND OF THE INVENTION

1. Field of the Invention

The invention in general relates to the structure and fabrication of integrated circuits and more particularly to process for fabrication of contact that penetrates the cell plate of a capacitor in a DRAM.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dies or chips. While integrated circuits are commonly referred to as "semiconductor devices" they are in fact fabricated from various materials which are either electrically conductive, electrically nonconductive, or electrically semiconductive. Silicon, the most commonly used semiconductor material, can be used in either the single crystal or polycrystalline form. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon.

CMOS (Complimentary Metal Oxide Semiconductor) technology is currently the most commonly used integrated circuit technology, and thus the present invention will be described in terms of silicon-based CMOS technology, although it is evident that it may find uses in other integrated circuit technologies. The term CMOS is now loosely applied to mean any integrated circuit in which both N-channel and P-channel MOSFETs (Metal-Oxide Semiconductor Field Effect Transistors) are used in a complimentary fashion. It should be noted here that because the dominant carrier in a MOSFET occurs in an inversion layer, the channel of an N-channel MOSFET is actually doped P-type and the channel of a P-channel MOSFET is actually doped N-type. CMOS integrated circuit fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the stating point. If other materials are used as the starting point, there may be differences in materials and structure as is well-known in the art, e.g. with N-type silicon as the starting point dopant types may be reversed, or P-type wells may be introduced.

One well-know integrated fabrication process is the photo-mask and etch process which comprises: creating a photolithographic mask containing the pattern of the parts to be fabricated, coating the integrated circuit wafer with a light-sensitive material called photoresist or resist, exposing the resist-ted wafer to ultraviolet light through the mask to soften or harden parts of the resist depending on whether positive or negative resist is used, removing the softened parts of the resist, etching the wafer to remove the part unprotected by the resist, and stripping the remaining resist Etching which forms part of the photo-mask and etch process is itself a highly developed process which is used in many instances besides in conjunction with the photomask. It is well-know that etches can be made that etch one material relatively rapidly while etching another material hardly at all. When an etch does not etch a material it is said to be "selective" to that material. That is, it selectively leaves that material while etching away other materials.

Most current-generation DRAM (Dynamic Random Access Memory) manufactures utilize CMOS technology. DRAM circuits comprise arrays of memory cells, each cell comprising two main components: a field effect transistor and a capacitor. In the most common circuit designs, one side of the transistor is connected to one side of the capacitor, the other side of the transistor and the transistor gate are connected to external connection lines called the bit line and word line, respectively, and the other side of the capacitor is connected to a reference voltage that is typically ½ the internal circuit voltage. Thus the fabrication of the DRAM cell essentially comprises the fabrication of a transistor, a capacitor, and three contacts to external circuits.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. The requirements of holding a charge large enough to be sensed for a long enough time for practical memory applications result in the capacitor being the largest of the circuit parts. Thus, the drive to produce smaller DRAM circuits has give risen to much capacitor development, which can be classified into three basic capacitor types: planar capacitors, trench capacitors and stacked capacitors. For reasons of available capacitance, reliability, and ease of fabrication, most manufacturers of DRAMS of 4-Megabit and larger capacity utilize stacked capacitor designs in which the capacitor covers nearly the entire area of a cell and in which vertical portions of the capacitor contribute significantly to the total charge storing capacity. In such designs the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly".

An area in a integrated circuit to which electrical connection is to be made is generally called an active area (A.A.). As capacitors have covered ever larger areas of individual cells and as the size of the cells has shrunk, the size of active areas as well as the corridors available for contacts to reach the A.A.'s has also shrunk. With these smaller spaces, the chances for leakage between the contacts and transistor and capacitor components and the chances of high resistance or open circuit contacts has increased. Thus a DRAM structure and fabrication process that provides more effective isolation of the contacts from the other parts of the DRAM circuit, optimizes the area in which contact may be made, and at the same time permits smaller contacts is highly desirable.

The business of fabricating CMOS semiconductor devices is a very competitive, high-volume business. Thus manufacturing efficiency is highly important. Product quality and reliability are also highly important It is well-known in the art that reducing the number of mask steps in the integrated circuit manufacturing process not only reduces manufacturing costs and time but also generally increases the quality and reliability of the end product, since the opportunities for disabling defects to occur are reduced. This in turn feeds back into further reduced manufacturing costs since scrapped product is reduced. Thus, a circuit structure and process that not only permits more compact devices but also reduces the number of fabrication steps, particularly the number of mask steps, would be a significant advance in the art.

One approach to solving the above problems in a state-of-the-art DRAM fabrication process is described in "A 1.28 $\mu m^2$ Bit-line Shielded Memory Cell Technology for 64 Mb DRAMs", by Y. Kawamoto et al, in IEEE 1990 Symposium on VLSI Technology, pp. 13–14. This fabrication uses a single photo step to define the storage node contacts and storage poly. This results in a reduced number of mask steps. However, this method also results in a buried bit-line which requires that the bit line be subjected to the subsequent steps in forming the capacitor which generally includes high temperature. Thus the bit line must be formed out of a temperature-resistant material, such as a silicide, which has higher resistance than a metal such as aluminum or tungsten and thus reduces the speed of the DRAM. In addition, the use of a silicide bit line requires two additional photo steps, i.e. the A.A. to silicide bit line contact photo and the silicide bit line photo.

Another approach is disclosed in "Two step Deposited Rugged Surface (TDRS) Storagenode and Self-Aligned Bitline-Contact Penetrating Cellplate (SABPEC) for 64 Mb DRAM STC Cell" by H. Itoh et al. in IEEE 1991 Symposium on VLSI Technology, pp. 9–10. See also "A Novel Zero-overlap/Enclosure Metal Interconnection Technology For High Density Logic VLSI's" by H. Shibata et al. in IEEE June 12–13 1990 VMIC Conference, pp. 15–21. The process and structure disclosed in the H. Itoh reference solves some of the above problems by utilizing a bit line contact that passes through the cell poly, since this technology allows the bit line to be formed after the capacitor. However, to insulate the bit line from the cell poly, two layers of insulation must be formed between the word lines, i.e. the word line spacers and the cell poly spacers. This greatly narrows the well for the bit line, and as a result the process is forced to use a poly/silicide bit line since metal would not properly fill such a narrow well. This again requires two additional photo steps. Moreover, in 64 Mbit DRAM technology the gap between the word line spacers is only about 0.2 $\mu m$ prior to the bit line contact definition. Thus the well between the spacers would be completely closed off with any cell poly oxide spacer thickness greater than 0.1 $\mu m$. A spacer this thin is very difficult to form and would likely result in an unacceptably large number of devices with cell-poly-to-bit-line current leakage. Further, the resulting contact well is very narrow, which makes it difficult to form contacts. The best contacts are made of metal, such as tungsten or aluminum. However, metal generally is too viscous to fill such narrow wells, thus one is forced to use poly plugs, which do not conduct as well, and which present further opportunities for defective contact where the metalization lines connect to the poly. The H. Shibata reference shows a contact plug that penetrates several fabrication layers to contact active areas. The reference discloses polysilicon spacers that do not close off the gaps between transistor gates on either side of the active areas, but would not apply to bit line contacts in DRAM technology as the poly spacers would short the bit line to the cell poly. Also this approach by Shibata does not self-align the bit-line contact with respect to the transistor poly (word lines) and would require the word lines to be spread further apart at the bit line contact to allow for misalignment.

A further approach is disclosed in U.S. Pat. No. 5,045,899 issued to Arimoto. This shows a DRAM fabrication process (see FIG. 12 in Arimoto) in which all the oxide is removed prior to deposition of the cell poly. This process does not utilize a self-aligned penetrating bit line contact. Thus it will result in a larger cell size for a given photolithographic capability. Thus a need exists for a DRAM structure and fabrication process which utilizes a self-aligned penetrating bit contact and a reduced number of photo-mask steps, and which is scalable and can utilize metal bit line contacts because it does not close off the gap between the word line spacers in 64 Mbit DRAMs.

3. Solution to the problem

The present invention provides a method of contact-through cell-poly fabrication technology which provides cell poly insulative spacers which does not close off the bit line contact well and leaves a fullwidth active area for the bit line contact electrical connection.

The invention provides a method of fabricating the bit line contact that provides a thick insulative layer between the active area and the cell plate, so that the bit line contact can penetrate the cell plate in an area of the device which is separated from the transistors and is less constricted.

The invention further provides in combination with the above features a method that utilizes cell poly spacers that are made of a material that etches similarly to the thick insulative layer, so that the insulative layer is penetrated with the same anisotropic etch that defines the insulative spacers.

The invention also provides a hard mask on top of the BPSG insulator which overlays the cell poly, so that the cell poly spacers travel down the side wall of the bit line contact well thereby providing a wide area at the top of the well that facilitates making an effective electrical connection between the contact and the metalization lines.

The invention further provides an efficient integrated circuit structure and process that, when the overall process is considered, requires fewer mask steps; in particular it provides a structure and process for making compact multi-megabit DRAM with minimal masking steps which exploit self alignment of multiple elements and provides large cell capacitance for a given cell area.

The present invention is particularly applicable to DRAM in that it provides a process for efficiently forming multiple contacts in combination with a capacitor of large area. However, once its use in DRAM is understood, it is evident that it can be applied in other circuits also.

SUMMARY OF THE INVENTION

The invention provides a method of fabricating a bit line contact that penetrates the capacitor cell plate in a stacked capacitor DRAM comprising the steps of providing a semiconductor wafer comprising: a semiconducting substrate having an active area to be contacted by the bit line contact;

a plurality of transistor gate members, one on either side of the active area; a transistor insulating spacer member between the transistor gate members and the active area; a lower insulating layer covering the transistor gate members, the transistor insulating spacer member, and the active area, the lower insulating layer being significantly thicker than the transistor gate members above the active area; a capacitor cell plate layer covering the lower insulating layer above the active area; and an upper insulating layer covering the capacitor cell plate layer; utilizing a photo-mask process to define a contact region penetrating the upper insulating layer, the capacitor cell plate layer, and the lower insulating layer above the active area, the region being wider than the distance between opposite sides of the transistor spacer member across the active area; creating a third insulating layer on the wafer; performing an anisotropic etch of the third insulating layer to expose the active area while forming a capacitor insulating spacer member covering the capacitor cell plate layer on the walls of the contact region, the opening between opposing sides of the capacitor spacer member being as great or greater than the width of the active area between opposing sides of the transistor spacer member; and forming a bit line contact in the contact region. Preferably the method further includes the step of creating an upper insulating layer etch stop layer over the upper insulating layer, and wherein the step of utilizing further comprises utilizing the photomask process to define the contact region penetrating the upper insulating layer etch stop layer. Preferably the step of utilizing a photo-mask process to define a contact region and creating a third insulating layer on the wafer comprises: utilizing the photo-mask process to define the contact region penetrating the upper insulating layer etch stop layer, the upper insulating layer, and the capacitor cell plate layer above the active area; creating the third insulating layer on the wafer, the third insulating layer made of a material that etches similarly to the lower insulating layer, and performing an anisotropic etch of the third insulating layer and the lower insulating layer to expose the active area while leaving the capacitor insulating spacer covering the capacitor conducting layer on the walls of the contact region, the upper insulating area etch stop layer serving as an etch stop on either side of the contact region.

In another aspect the invention provides a method of fabricating a capacitor insulating spacer for a contact that passes through a capacitor cell conducting layer in an integrated circuit DRAM, the method comprising: providing a semiconductor wafer comprising: a semiconducting substrate having an active area; a plurality of transistor gate members, one on either side of the active area; a transistor insulating spacer member between the transistor gate members and the active area; a lower insulating layer covering the transistor gate members, the transistor insulating spacer member, and the active area; a capacitor conducting layer covering the lower insulating layer above the active area; and an upper insulating layer covering the capacitor conducting layer, creating an upper insulating layer etch stop layer over the upper insulating layer, utilizing a photo mask process to define a contact region penetrating the upper insulating layer etch stop layer, the upper insulating layer, and the capacitor conducting layer above the active area; creating a third insulating layer on the wafer, the third insulating layer made of a material that etches similarly to the lower insulating layer, and performing an anisotropic etch of the third insulating layer and the lower insulating layer to expose the active area while leaving the capacitor insulating spacer covering the capacitor conducting layer on the walls of the contact region, the upper insulating area etch stop layer serving as an etch stop on either side of the contact region. Preferably, the contact region is sufficiently wide so the opening between opposing sides of the capacitor spacer member is as great or greater than the width of the active area between opposing sides of the transistor spacer member. Preferably, the semiconductor wafer includes an active area etch stop layer between the lower insulating layer and the transistor gate members, transistor spacer member, and active area and the step of performing an anisotropic etch comprises etching the third insulating layer and lower insulating layer with a first etch and then etching the active area etch stop layer with a second etch. Preferably, the step of etching the active area etch stop layer self aligns the capacitor spacer member with the transistor gate members. Preferably, the upper insulating area etch stop layer is made of poly silicon and the active area etch stop layer is made of aluminum oxide. Alternatively, the upper insulating area etch stop layer and the active area etch stop layer are made of silicon nitride.

In a further aspect the invention provides a method of fabricating a capacitor insulating spacer for a contact that passes through a capacitor cell conducting layer in an integrated circuit DRAM, the method comprising: providing a semiconductor wafer comprising: semiconducting substrate having an active area; a plurality of transistor gate members, one on either side of the active area, a transistor insulating spacer member between the transistor gate members and the active are; a lower insulating layer covering the transistor gate members, the transistor insulating spacer member, and the active area; a capacitor conducting layer covering the lower insulating layer above the active area; and a hard mask layer over the capacitor conducting layer; utilizing a photo-mask and etch process to define a contact region penetrating at least the hard mask layer and the capacitor conducting layer above the active area; creating an cell insulating spacer layer on the wafer, the cell insulating spacer layer made of a material that etches differently than the hard mask layer; and performing an anisotropic etch of the cell insulating spacer layer to create the capacitor insulating spacer covering the capacitor conducting layer on the walls of the contact region, the capacitor insulating spacer layer traveling down the side walls of the contact region during the anisotropic etch so that the upper portion of the contact region is wider than the distance between opposite walls of the spacer. Preferably, the step of performing an anisotropic etch further comprises etching through the lower insulating layer. Preferably, the step-of providing further comprises providing and upper insulating layer between the capacitor conducting layer and the hard mask layer, and the step of utilizing further comprises utilizing the photo-mask and etch process to penetrate the upper insulating layer. Preferably, the step of providing further comprises providing an etch stop layer between the active area and the lower insulating layer, the step of performing an anisotropic etch further comprises stopping the anisotropic etch on the etch stop layer, and the method further comprises the step of removing the etch stop layer after the step of performing an anisotropic etch.

The invention not only provides a method of making contacts that penetrate the capacitor cell plate in 10 DRAMs without narrowing the bit line contact region while at the same time producing a contact region that is wider at the top and thus lends itself to improved metalization, but also provides a way of doing so in a process that utilizes less mask steps and a significant amount of self alignment as compared with prior art DRAM processes Numerous other features, objects and advantages of the invention will become apparent from the following description when read in conjunction with the accompanying drawings.

DESCRIPTION OF THE PREFERRED EMBODIMENT

1. Overview

Figure 12:
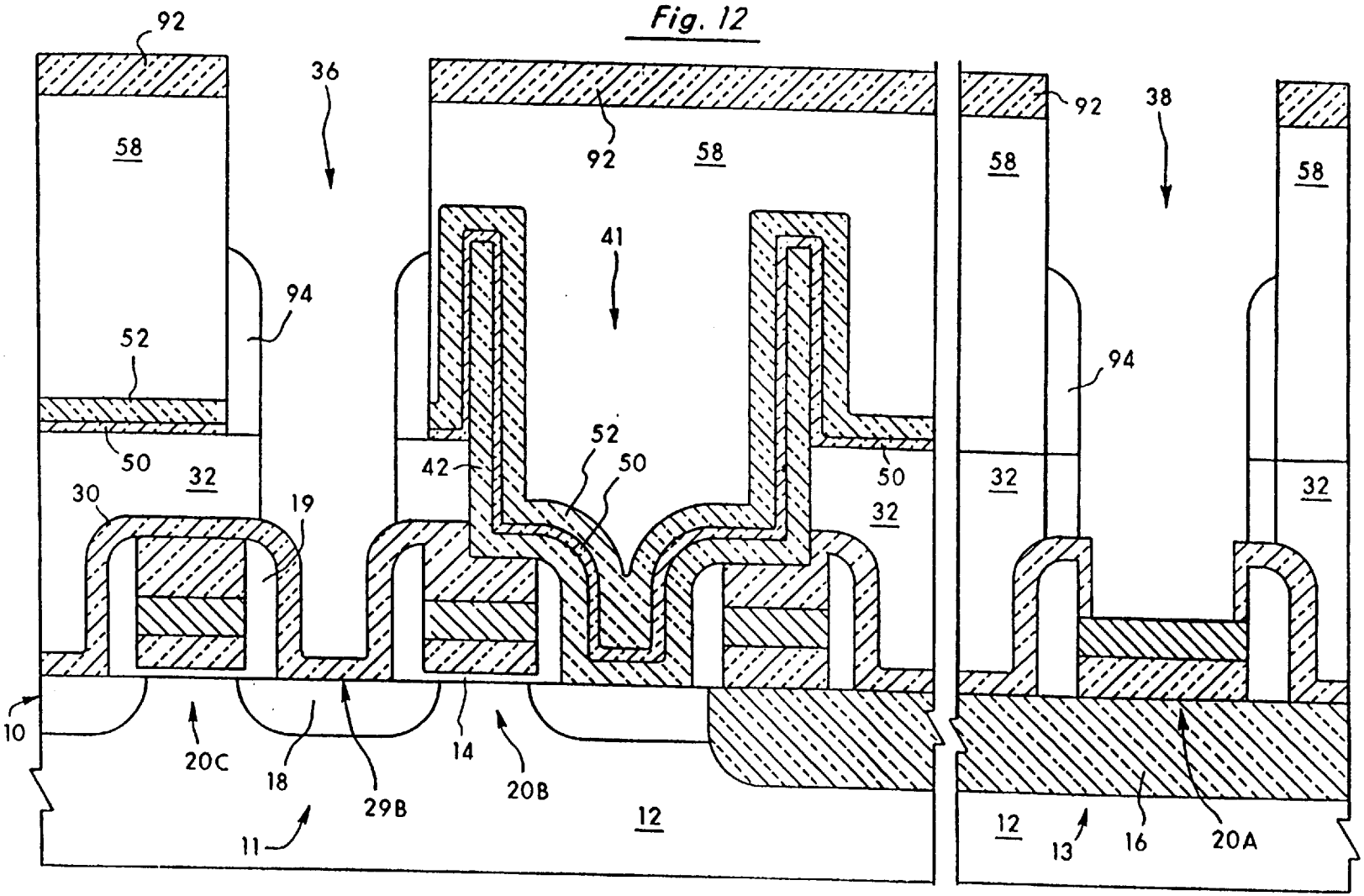
FIG. 12 is a cross-sectional view of the DRAM wafer of FIG. 11 following etch of the cell poly insulating spacer layer to form the cell poly spacers.

Turning now to FIG. 12, an integrated circuit wafer 10 according to the invention is shown at a stage of fabrication just after the spacers 94, which insulate the future bit line contact area 36 from the cell poly 82, have been formed. It should be understood that the figures are not meant to be actual cross sectional views of any particular portion of an actual semiconducting device, but are merely idealized representations which are employed to more clearly and fully depict the process of the invention than would otherwise be possible. Wafer 10 includes an array region 11, which includes many identical cells (one cell shown), and a periphery area 13 in which the metal to poly 1 contacts will be located. Wafer 10 comprises a conventional silicon substrate 12 having a thin gate oxide layer 14, thick field oxide areas 16, doped wells, such as 18, transistor gate members 20B, 20C transistor insulating spacer members, such as 19, on either side of each transistor gate member, such as 20B, a thick lower insulating layer 32, a capacitor 140 comprising a storage poly layer 42, a dielectric layer 50, and a cell poly layer 52, and a thick upper insulating layer 58 covering the capacitor 140 and other circuit elements. As can be seen in FIG. 12, above the active area 29B, the thick insulating layer 32 is significantly thicker than the transistor gate member 20B and thus separates the cell poly layer 52 from the crowded area of the transistor members 20B, 20C and raises poly layer 52 to a region of the device which is relatively uncrowded, so that the spacers 94 don't get in the way of other elements of the wafer 10. In later steps of the fabrication process (FIGS. 13 and 14), the etch stop layer 30, is etched away and a bit line contact 100 that contacts the active area 29B is formed. The invention provides a fabrication method, described in detail below, which results in relatively thick insulating spacers 94 which don't close off the active area 29B between spacers 19. Further, a wide gap (filled by tungsten plug 99 in FIG. 14) is left at the top of the bit line contact region 36 which facilitates making effective electrical contact between a conventional metalization line (not shown) and contact 100.

2. Detailed Description of the Fabrication

Figure 1:
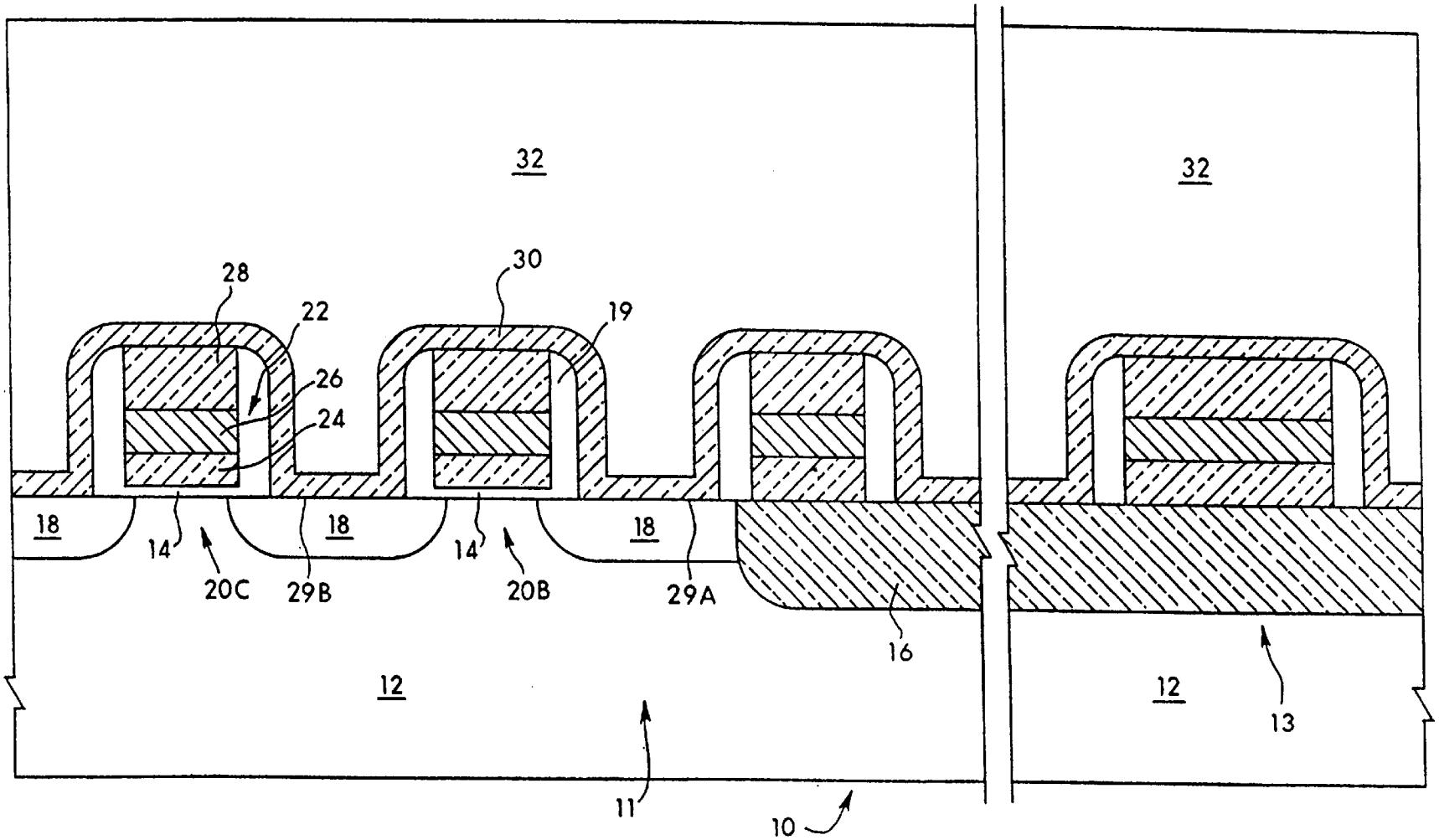
FIG. 1 shows a cross-sectional view of a portion of a partially fabricated DRAM integrated circuit according to the preferred embodiment of the invention comprising a silicon substrate that has been oxidized, and following the formation of doped wells, field oxide region transistors, an insulating oxide layer over the transistor gates, insulating oxide spacers on either side of the transistors, and an etch stop layer.

Turning now to a more detailed description of the invention, FIG. 1 shows a cross-section of a preferred embodiment of an integrated circuit wafer 10 in a stage just prior to the first of the photo-mask steps which will define the capacitor and contacts. The wafer 10 preferably comprises a lightly doped P-type single crystal silicon substrate 12 which, in well-known processes, has been oxidized to form a thin gate insulating layer 14 and thick field oxide regions 16, and exposed to implantation processes to form areas 18 of N+ doping. Transistor gate members 20B, 20C comprising gate insulating oxide layer 14, a gate conducting layer 22, sometimes referred to as the word line in the DRAM structure, and an insulating protective layer 28. The gate conducting layer 22, or word line, preferably comprises a polysilicon layer 24, referred to alternatively as the transistor poly or poly 1 herein, and a tungsten silicide ($WSi_x$)

layer 26. Gate insulating protective layer 28, preferably silicon oxide, has been formed on top of the silicide layer 26 and transistor insulating spacer members 19, preferably silicon oxide, have been formed on either side of each of transistor gate members 20B, 20C. A thin first etch stop layer, preferably aluminum oxide ($Al_2O_3$), has been deposited over the wafer, covering the transistor gate members 20B, 20C, spacer members 19, and active areas 29A, 29B between the transistor gate members. The DRAM capacitors 31 will contact some of these active areas, which we shall call the first active areas 29A (FIG. 6A), and the bit line contacts will contact other of these active areas, which we shall refer to as the second active areas 29B. Then a thick lower insulating layer 32, preferably borophospho-silicate glass (BPSG), has been deposited and planarized, preferably with a CMP (Chemical Mechanical Polish) process. It should be understood that in the above discussion and in the discussion following, some well-known aspects have been simplified in order to not unduly complicate the discussion. For example, the structure of the doped areas, such as 18, generally will be more complex than shown. In addition, the particular materials, structures and process are intended only to illustrate the invention so that it can be fully and clearly understood. A wide range of other material structures and process may be substituted for the particular ones presented and still be within the contemplation of the invention. For example, in one preferred embodiment, silicon nitride ($Si_3N_4$) is used instead of silicon oxide for the protective insulating layer 28 and spacer members 19 and also may be used for the etch stop layer 30. Or SOG (Spin-On-Glass), PI (Polyamide Insulator), CVD (Chemical Vapor Deposited) oxide or other insulators may be used in place of the BPSG insulator 32. Any other satisfactory materials may be substituted for any of the above Or, additional materials, structures and processes may also be added to those disclosed. For example, a thin oxide insulator may be deposited over the active areas 29 to prevent the etch of the etch stop layer 30 from stopping on the silicon of the active areas.

Figure 2:
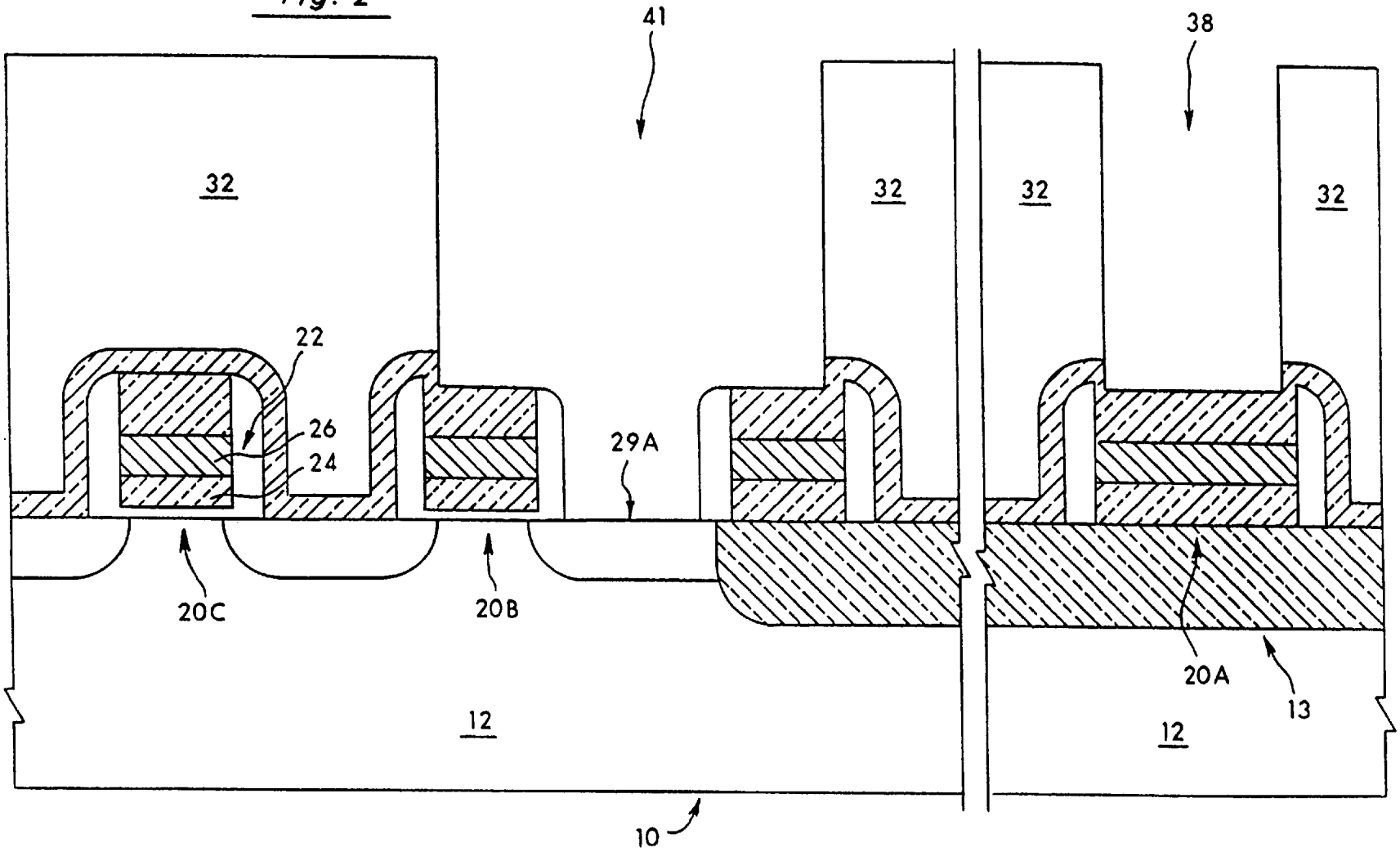
FIG. 2 is a cross sectional view of a portion of the DRAM wafer of FIG. 1 following the deposition of a thick insulating layer, planarization of the insulating layer, a photo-mask step followed by a selective oxide etch to open holes for the storage poly container, the future metal to poly 1 contact regions, and the future metal to cell poly contact regions, a plasma etch of the etch stop layer, then a resist strip.
Figure 7:
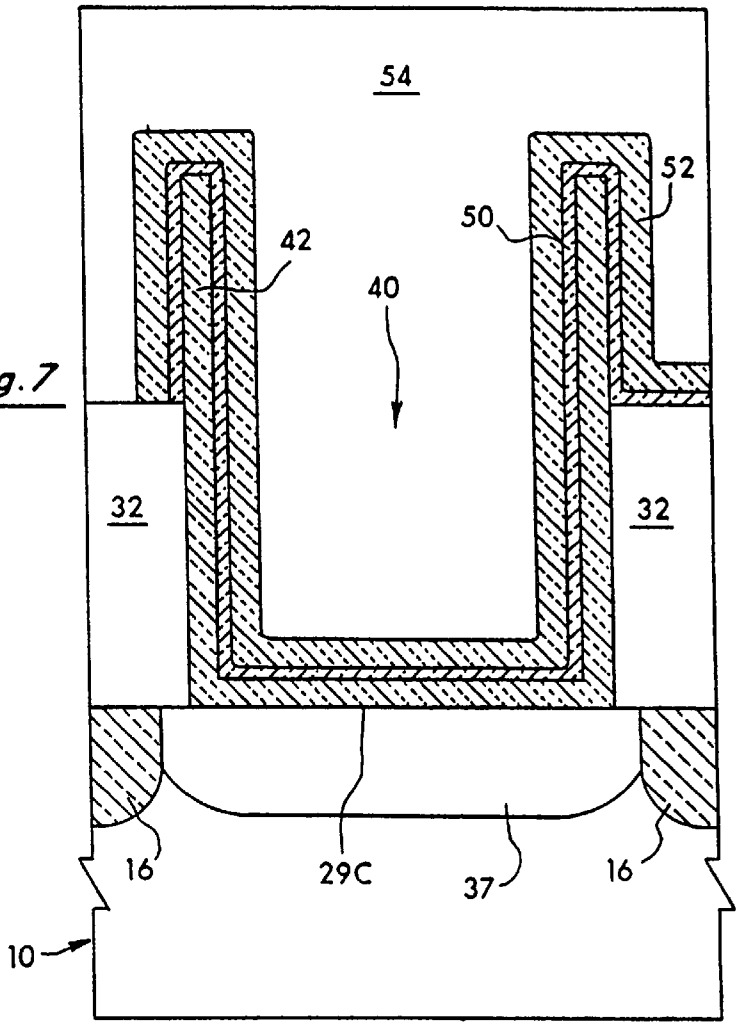
FIG. 7 is a cross-sectional view of another portion of the DRAM wafer of FIG. 6A showing the metal 1 to cell poly contact region at the same stage in the fabrication process.

Turning now to FIG. 2, the wafer 10 is subjected to the storage node poly photo-mask process, sometimes called the "container" photo process as it opens the holes 41 in the insulating film 32 which will contain the storage capacitor. In the preferred embodiment of the invention it also opens holes which define the contact regions, such as 38. First a conventional resist layer (not shown) is deposited followed by a conventional photomask process to open holes or containers 41 in the resist where the storage poly 42 will go, to open holes 38 in the resist where the future metal to transistor poly contacts will go, and to open holes 40 in the resist where the future metal to cell poly contacts will be located (FIG. 7). Optionally, an isotropic $O_2$ plasma etch may be performed to widen the resist openings and increase the storage poly area beyond the limitations of the photo resolution. Then the wafer is subjected to an anisotropic oxide etch, preferably an RIE (Reactive Ion Etch), referred to herein as a "first etch process" which etches through the film 32 to stop completely on the etch stop layer 30. The etch stop is selectively etched using a "second etch process" to expose the silicon substrate 12 at the first active areas 29A which the storage poly 42 will contact, to expose the first transistor gate members 20A, where the future transistor poly contacts will be located, and to expose the active area 29C (FIG. 7) where the future cell poly contacts will be located. These etches form the capacitor containers 41 in which the future capacitors will be located, the transistor poly regions 38 or, more broadly, the gate conducting layer contact regions 38, where the future contacts to the transistor gate conducting layers 22 will be formed, and the cell poly contact regions 40 (FIG. 7), or, more broadly, the capacitor conducting layer contact regions 40, where the contacts to the second capacitor conducting layer 52 will go. After the containers and contact regions are formed, the resist is stripped.

Figure 3:
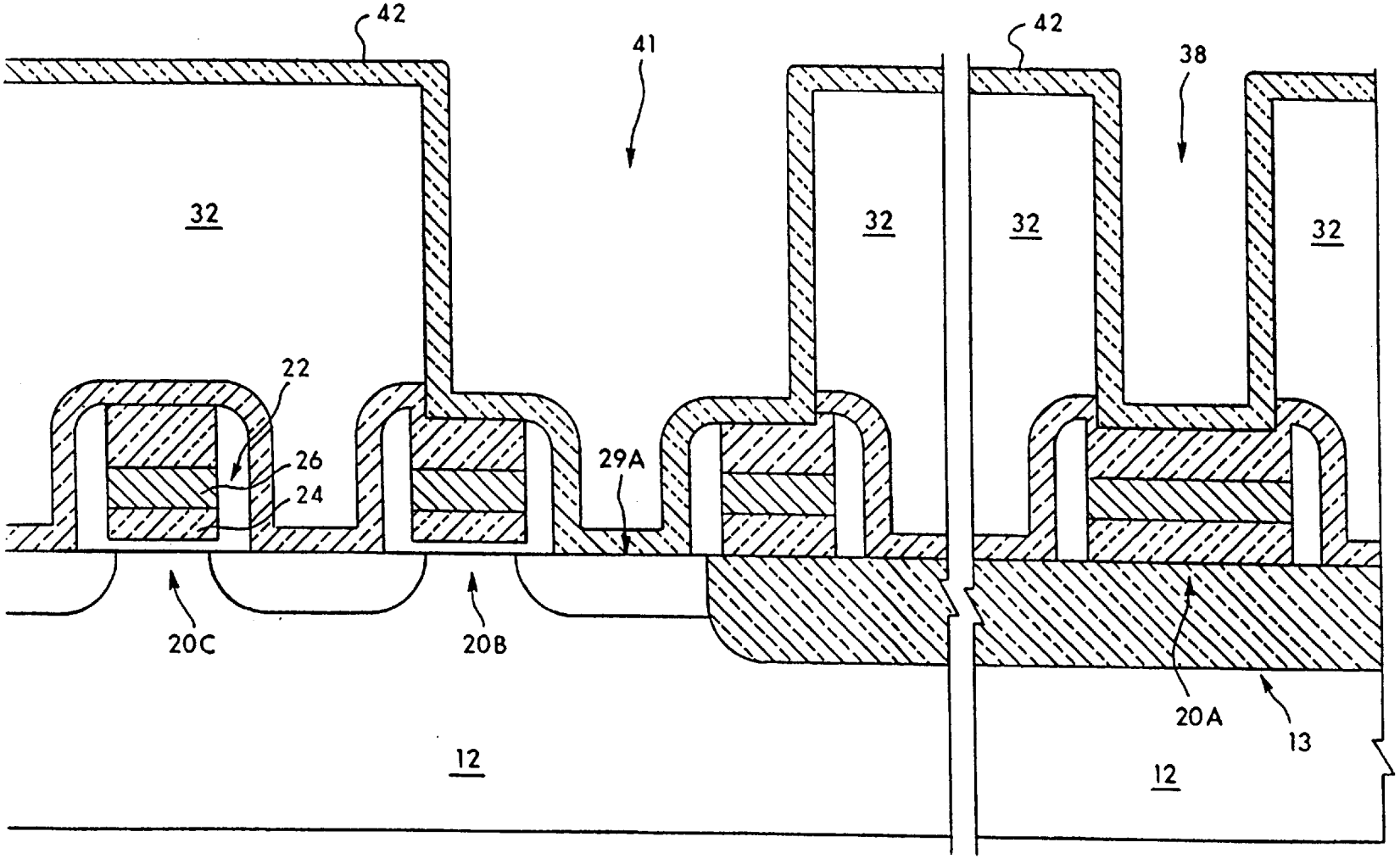
FIG. 3 is a cross-sectional view of a portion of the DRAM wafer of FIG. 2 following storage poly deposition.
Figure 4:
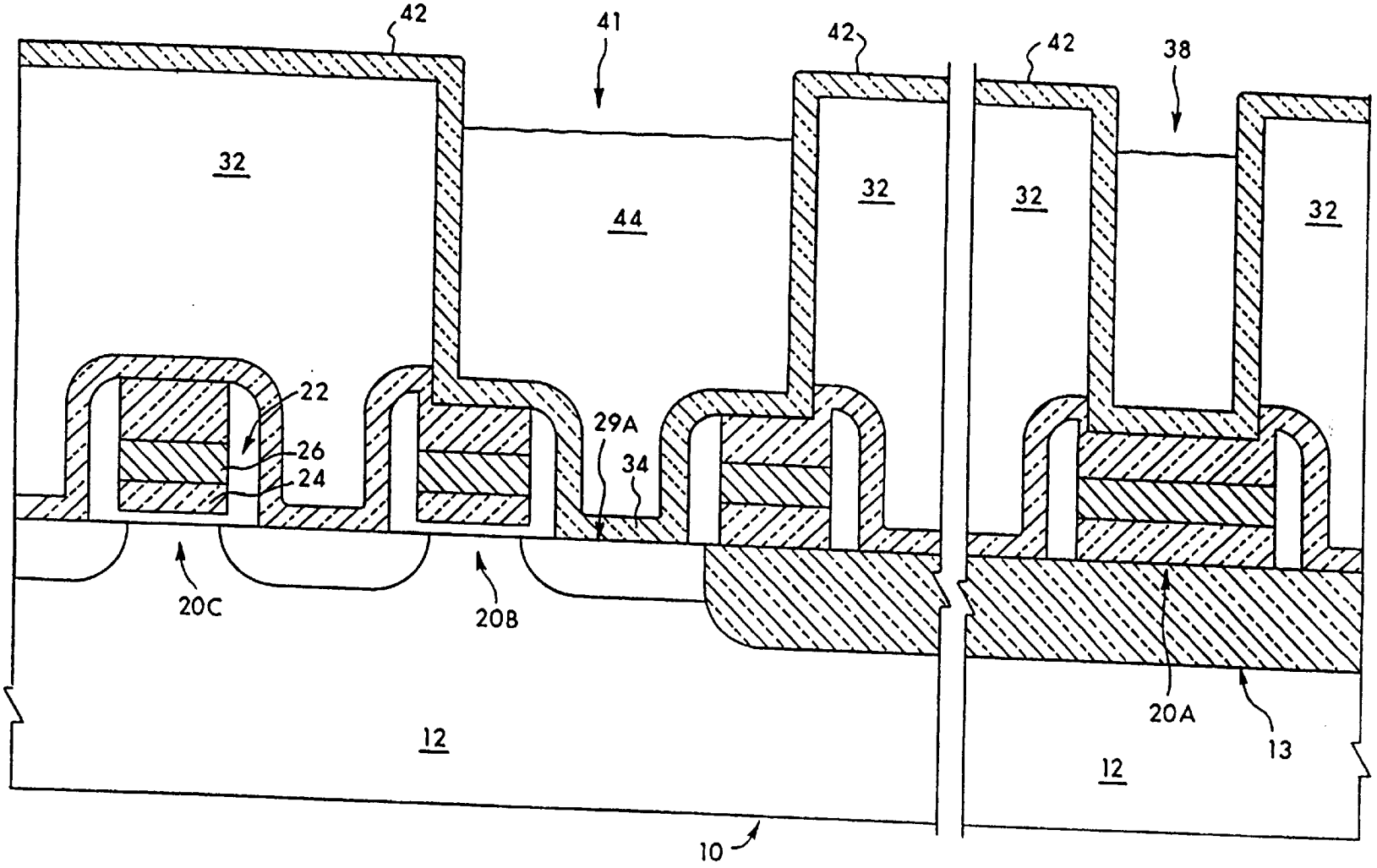
FIG. 4 is a cross-sectional view of a portion of the DRAM wafer of FIG. 3 following a resist deposition and partial etch of the resist.

Turning to FIG. 3, the storage poly 42, sometimes referred to herein as the capacitor first conducting layer 42, is deposited. Preferably it is insitu doped, rough textured poly which yields increased capacitance. Then, as shown in FIG. 4, resist 44 is spun on the wafer 10 and then partially etched in a blanket $O_2$ plasma etch to leave the resist 32 only in the containers 41 and contact regions 38 and 40 as shown in FIG. 4.

Figure 5:
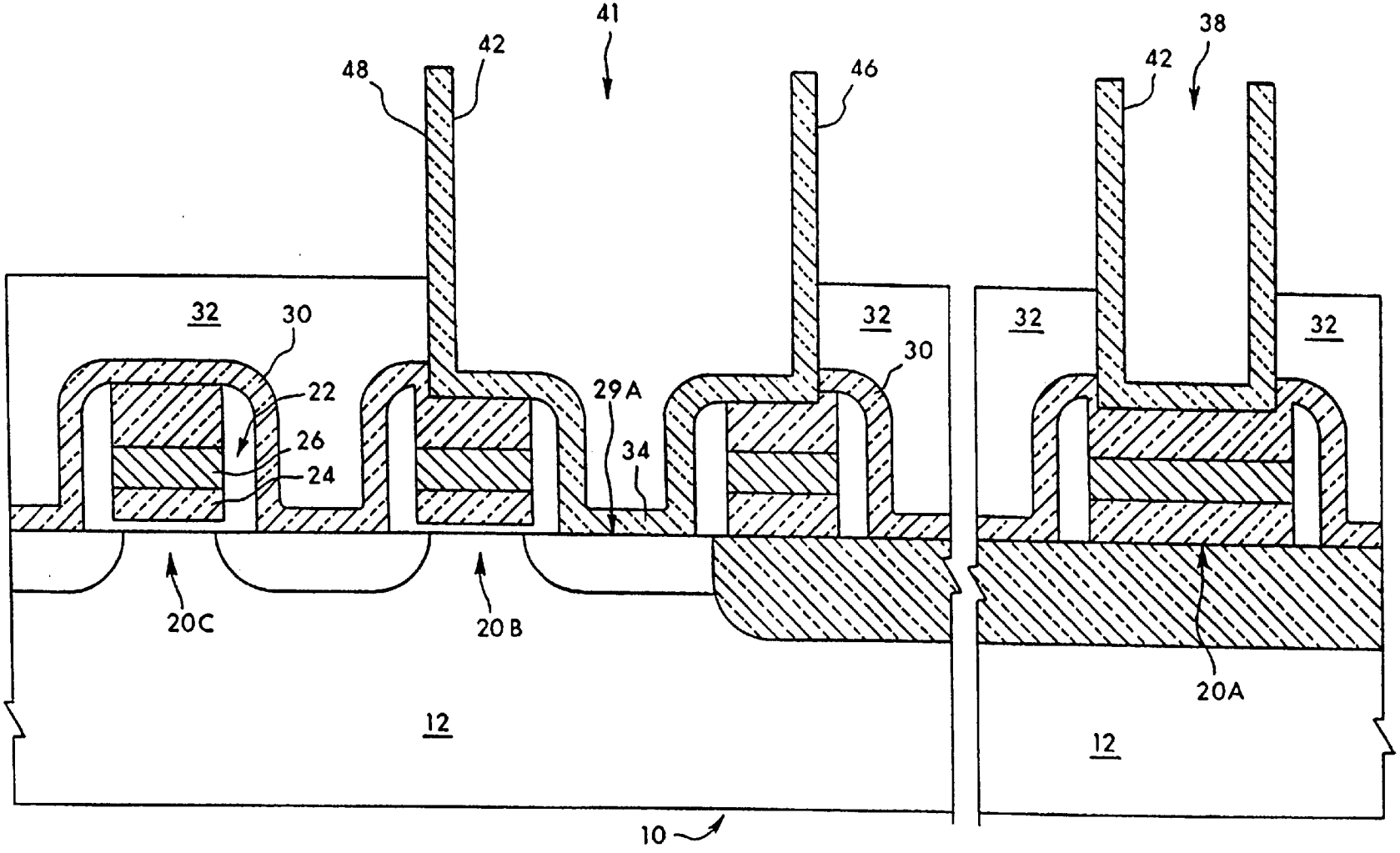
FIG. 5 shows a cross-sectional view of a portion of the DRAM wafer of FIG. 4 following a partial etch of the storage poly, a controlled oxide etch, and a strip of the resist.

FIG. 5 shows the next step, which preferably is a blanket poly etch which isolates the storage poly nodes 46. It is noted that the invention also contemplates that this etch step may be eliminated and replaced with a CMP isolation of the storage poly as will be discussed in connection with FIG. 15 below. The blanket poly etch may be followed with an optional partial blanket oxide etch which is selective to poly so as not to etch the exposed storage poly 42. This optional oxide etch exposes much of the outer peripheries 48 of the storage poly 42 which significantly increases the capacitance area of the cell. This etch is preferably a timed etch to a precise depth, though other etch methods that result in an exact depth may be used. This etch is a key aspect of the invention. In the prior art, this etch went all the way through the oxide 32 to the etch stop layer 30 or silicon 12 if no etch stop layer was used. It is critical to the invention that this etch be only a partial etch (or no etch at all), preferably, leaving 0.3 $\mu$m of oxide 32 above the etch stop layer 30 over the transistor poly 24. As we shall see below, this partial etch allows a single photomask step to define the bit contacts, the poly 1 contacts and the cell poly contacts. After this etch the resist 44 is then stripped.

Figure 6A:
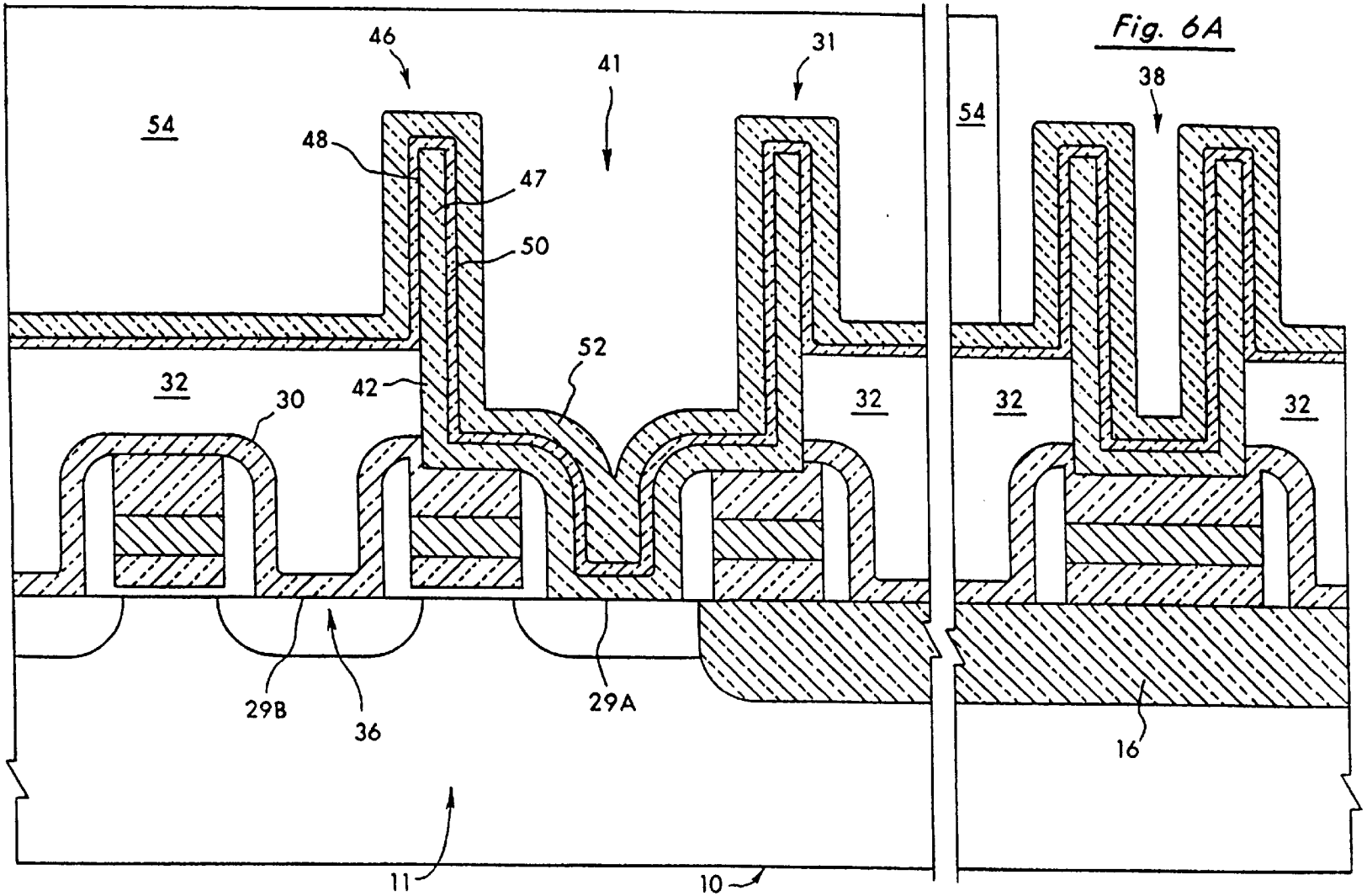
FIG. 6A shows a cross-sectional view of a portion of the DRAM wafer of FIG. 5 following deposition of the cell dielectric and cell poly, and a photo-mask step to form a cell poly resist pattern.

FIG. 6A shows the structure resulting from the next stages of fabrication for the portion of the wafer 10 shown in FIG. 5, and FIG. 7 shows the structure resulting from these same stages at a future metal to cell poly contact, which is located in the corners of the array. The capacitor dielectric 50, sometimes referred to herein as the cell dielectric 50, is deposited. The cell dielectric 50 is preferably silicon oxide, though it may also be silicon nitride or other insulating material. If silicon nitride is selected, an optional wet oxidation may follow for improved defect density. The cell poly, or capacitor second conducting layer 52, often referred to in the art as the "cell plate" is then deposited, which is preferably insitu-doped poly. The cell poly resist 54 is deposited, and then the second photomask step defines the cell photo pattern. In the embodiment shown in FIGS. 6 and 7, the array 11 is left fully covered including the location 36 of the future bit line contact.

Figure 8:
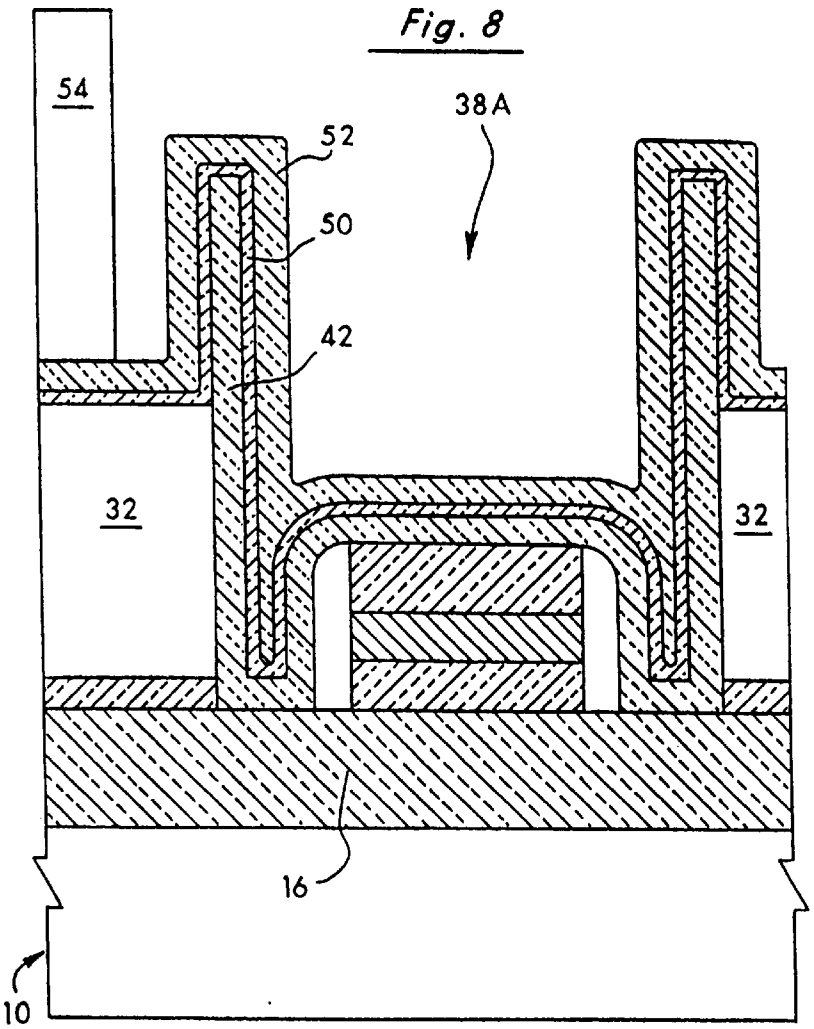
FIG. 8 is a cross-sectional view of an alternative embodiment of the DRAM wafer of FIG. 6A showing an alternative structure for the future metal to poly 1 contact region at the same stage of the fabrication process.

FIG. 8 shows an alternative embodiment of the future metal to transistor poly (poly 1) contact region 38A. In this embodiment more of the area around the contact was exposed in the first photo-mask step with the result that more of the etch stop layer 30 was removed and the storage poly 42, cell dielectric 50 and cell poly 52 covers a wider area This embodiment results in a larger metal to poly 1 contact area which is less likely to be closed off by a subsequent oxide deposition which isolates the cell poly and which will be discussed below.

Figure 6B:
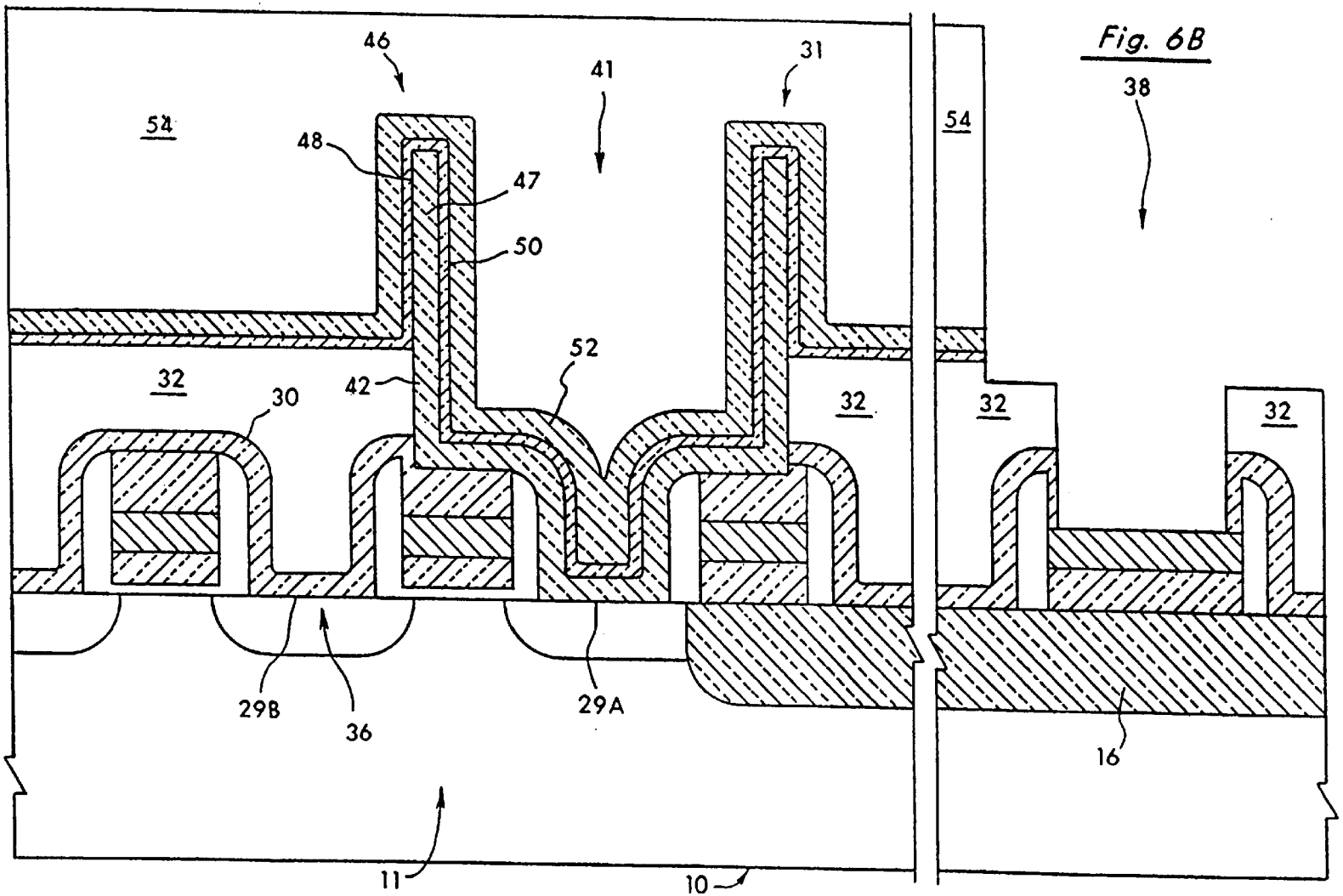
FIG. 6B shows a cross-sectional view of the DRAM wafer of FIG. 6A following selective etches of the cell poly, cell dielectric, storage poly, and, optionally, the insulator above the transistor poly in the regions of the future transistor poly contacts.
Figure 9:
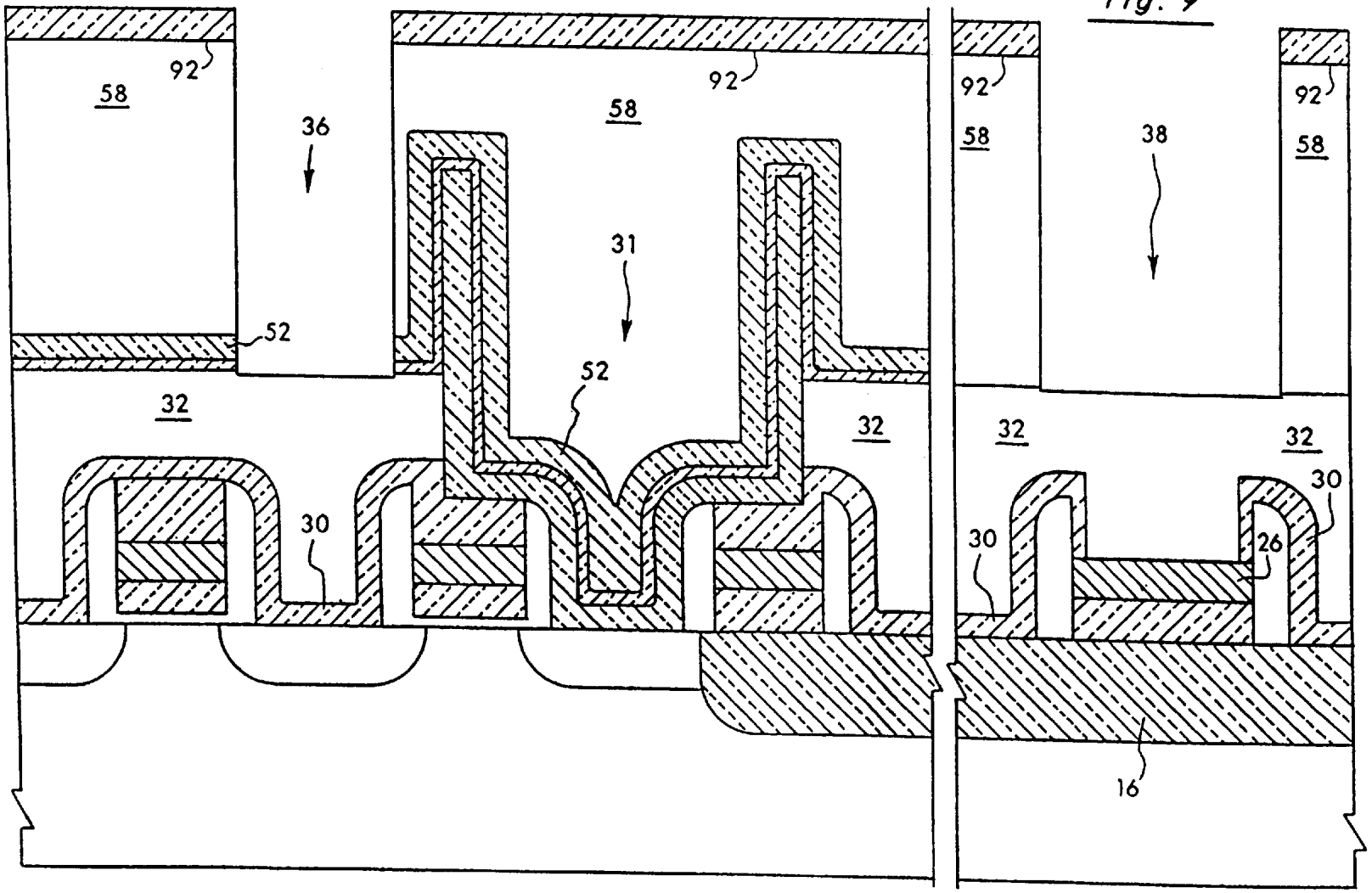
FIG. 9 is a cross-sectional view of the DRAM wafer of FIG. 6B following a resist strip, a thick insulator deposition and planarization, deposition of a silicon nitride or poly layer, a photo-mask step, a timed oxide etch to reach the cell poly in the future bit line contact region, a poly etch through the cell poly, and then a resist strip.
Figure 10:
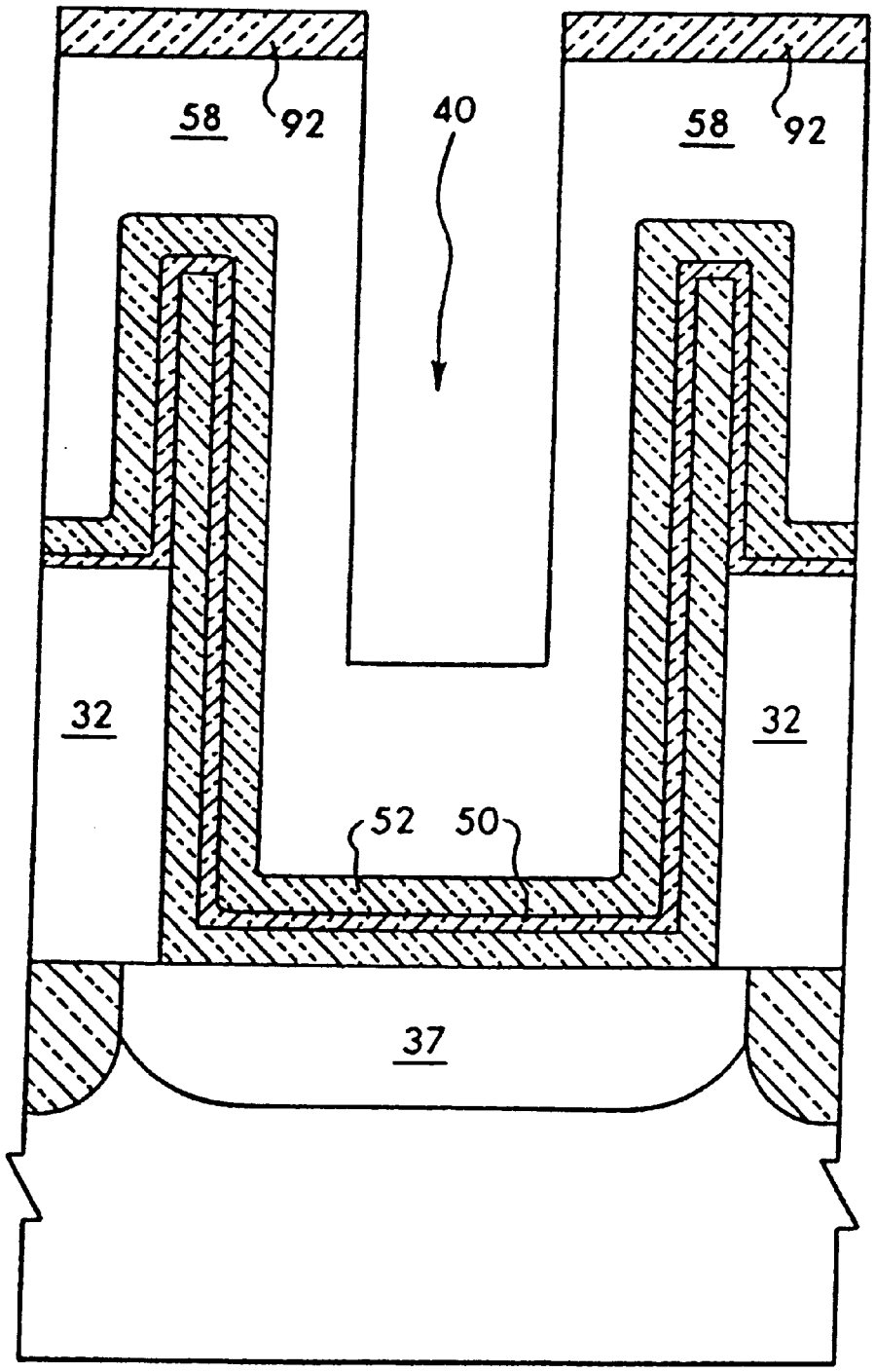
FIG. 10 is a cross-sectional view of another portion of the DRAM wafer of FIG. 9 showing the metal 1 to cell poly contact region at the same stage in the fabrication process.

Referring now to FIG. 6B, there follows an isotropic cell poly etch, an isotropic cell dielectric etch, an tropic storage poly etch, and an optional anisotropic etch of insulator 28 in areas 38 of the future transistor poly contacts and peripheral active area contacts, which remove the cell poly, cell dielectric, storage poly, and insulator 28, respectively from the areas 38 and 38A of the future metal to poly 1 contacts. Turning to FIGS. 9 and 10, the resist is then stripped followed by a blanket deposition of upper insulating layer 58, preferably BPSG oxide, which is followed by a planarization, preferably CMP. The next step is a deposition of a second etch stop layer 92, which in the preferred embodiment is polysilicon, but could also be silicon nitride or any other material that has a good selectivity in the etch of the cell poly spacers to be described below. This second etch stop layer 92 will be used as the "hard mask" in a future contact etch to be discussed in connection with FIG. 12 below. Then follows the third or contact photo process, defining the bit line contact regions 36, and redefining the metal 1 to poly 1 contact regions 38 around the periphery of the array, and the cell poly contact regions 40 (FIG. 10). At the contact etch step, the poly (or nitride) 92 is etched through, then follows a timed oxide etch to a depth of 1.0+/−0.2 $\mu$m. This oxide etch will ensure that the cell poly 52 is reached at the bit line contact regions 36 but will not be deep enough to reach the cell poly in the metal 1 to cell poly contact regions 40 (FIG. 10) or the transistor poly in the metal 1 to transistor poly contact regions 38. This oxide etch process shall be referred to herein as a first etch process, in contradistinction to the etch process that etches the etch stop layer 30, which will be referred to as the second etch process. It is noted that an etch step which reaches the cell poly 52 in the bit line contact regions 36 but does not reach the cell poly 52 in the metal 1 to cell poly contact regions 40 (FIG. 10) or the transistor poly in the metal 1 to transistor poly contact regions 38 is possible because of the partial etch (or no etch) discussed above in connection with FIG. 5. That partial etch (or no etch) left the cell poly 52 in the region of the bit line contact regions 36 raised above the level of the cell poly in the areas where the storage poly container was patterned, such as the future metal to cell poly contact regions 38. After the oxide etch, the exposed cell poly 52 in the bit line contact regions 36 is then etched through either anisotropically or isotropically to recess it back from the future bit line contact The resist is then stripped.

Figure 11:
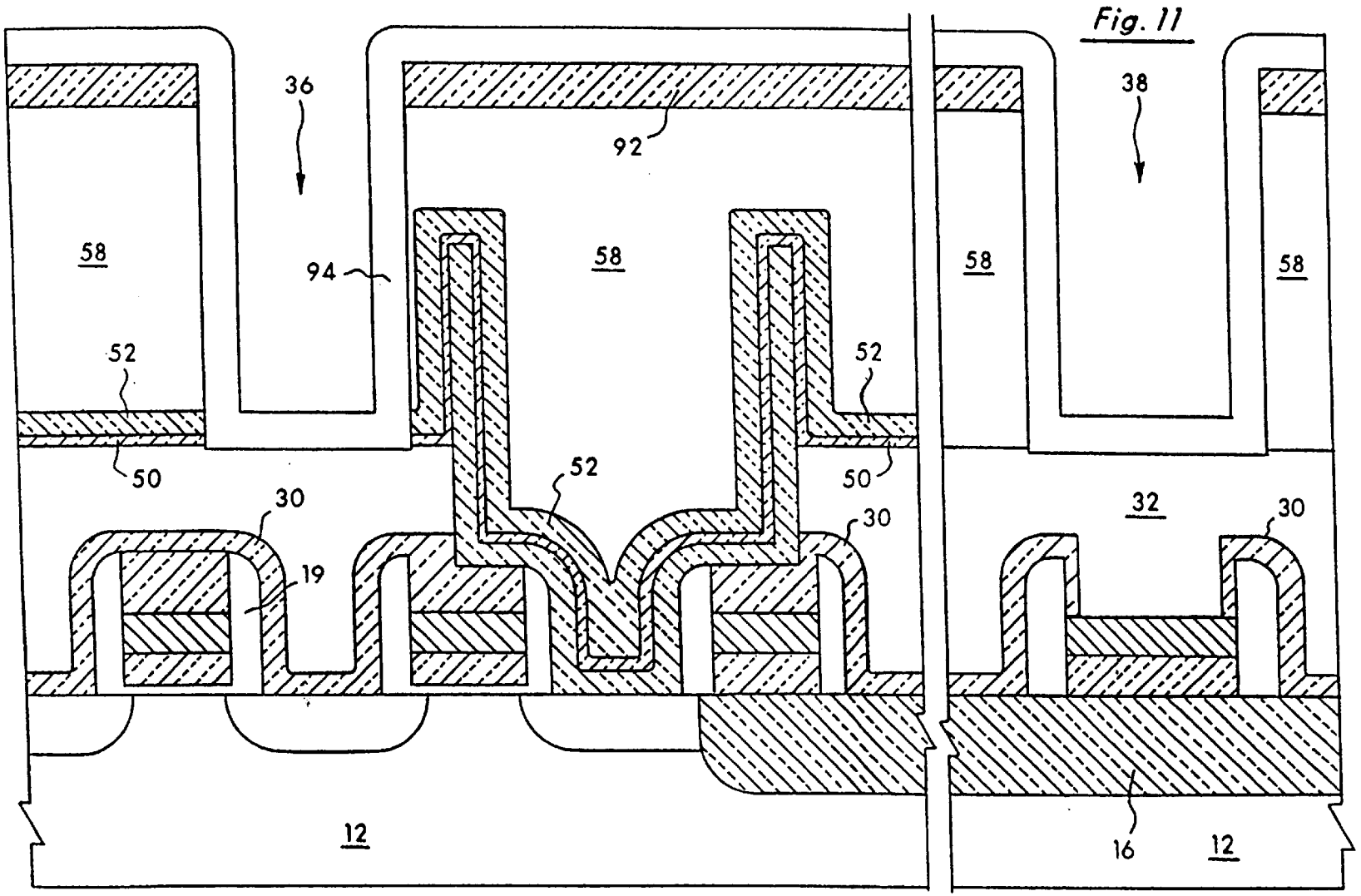
FIG. 11 is a cross-sectional view of the DRAM wafer of FIG. 9 following the deposition of a cell poly insulating spacer layer.

FIGS. 11 and 12 depict the preferred embodiment of the formation of the bit line contact regions 36 and metal to poly 1 contact regions 38. In FIG. 11 a third insulating layer 94 has been deposited. This is preferably oxide, but may also be nitride. Referring now to FIG. 12, there follows an oxide etch, preferably an RIE oxide etch, through the cell dielectric 50 and all the way to the etch stop layer 30 or all the way to the silicon 12 if no etch stop layer 30 is used to self align the future bit line contact. Note how the insulating spacers 94 travel down the side wall during this etch. The poly 92 (or nitride) acts as a hard mask during this part of the etch. Etch stop layer 30 is then etched and contact formation and metalization proceeds as before. Preferably in this embodiment the contact photo mask defines a bit line contact region 36 that is sufficiently wide so the opening between opposing sides of the spacer member 94 is as great or greater than the width of the active area 29B between opposing sides of transistor spacer member 19. The advantage of this embodiment of the bit line contact region 36 formation is that when used with an etch stop layer 30, the capacitor insulating spacers 94 will not have a possibility of closing off the contact region 36, and the bit line contact region 36 will be the full width between the word line spacers 19. In addition, the width of the bit line contact region 36 is wider at the top of the region, permitting better step coverage of subsequent conductor deposition for a given contact size.

Figure 14:
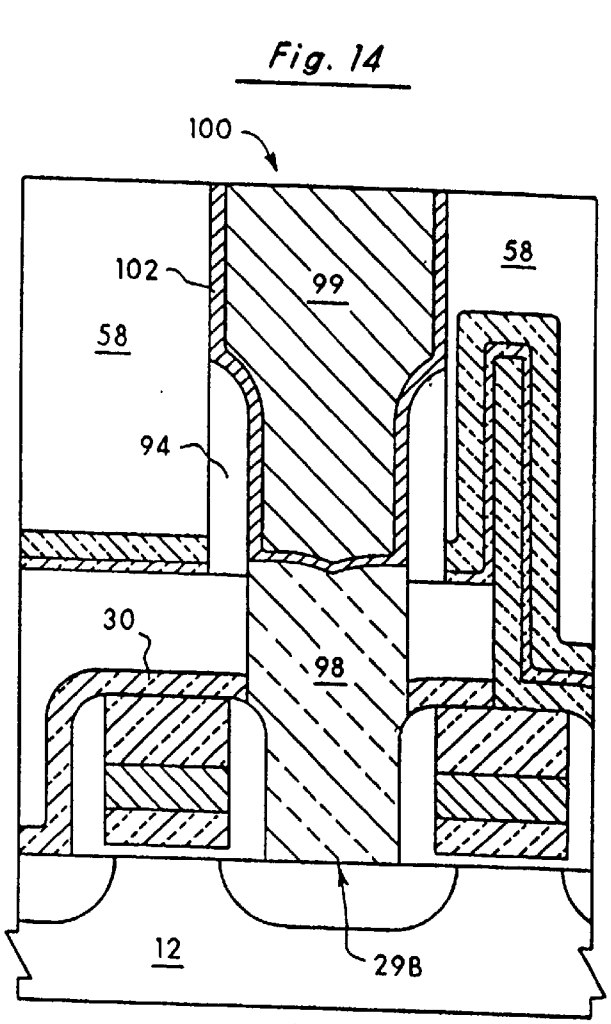
FIG. 14 is a cross-sectional view of the DRAM wafer of FIG. 13 following etch of the poly plug and deposition of a diffusion barrier and tungsten metal plug.
Figure 13:
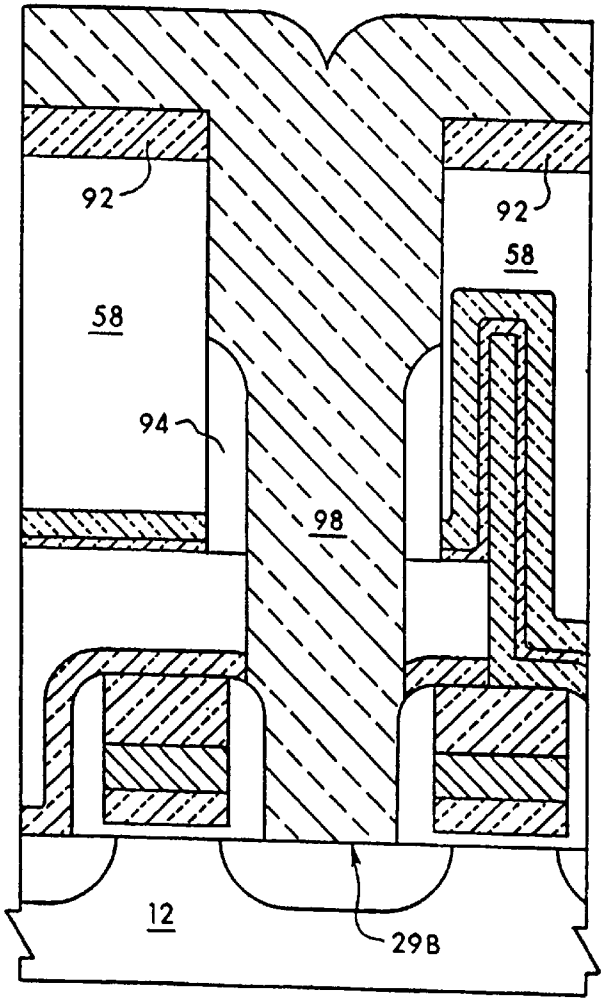
FIG. 13 is a cross-sectional view of the DRAM of wafer FIG. 12 following etch of the etch stop layer and deposition of a poly plug.

Referring now to FIGS. 13 and 14, an alternative embodiment to the conventional metalization structure and process to fabricate the bit line contact 100 is shown. After the etch to the silicon substrate 12, a poly plug 98 is deposited, preferably insitu doped N+poly. Then follows a poly etch to recess the poly plug 98. Next, a photo step and etch can be used to open peripheral P+ active area contacts. Then follows the deposition of a diffusion barrier layer 102, preferably titanium nitride (TIN), although it also may be titanium tungsten (TiW) or any other material used as a diffusion barrier in semiconductor devices. Then a metal plug 99, preferably tungsten, is deposited and planarized, preferably by a CMP process. Then follows conventional metal line deposition steps, etc. to finish the processing.

Figure 15:
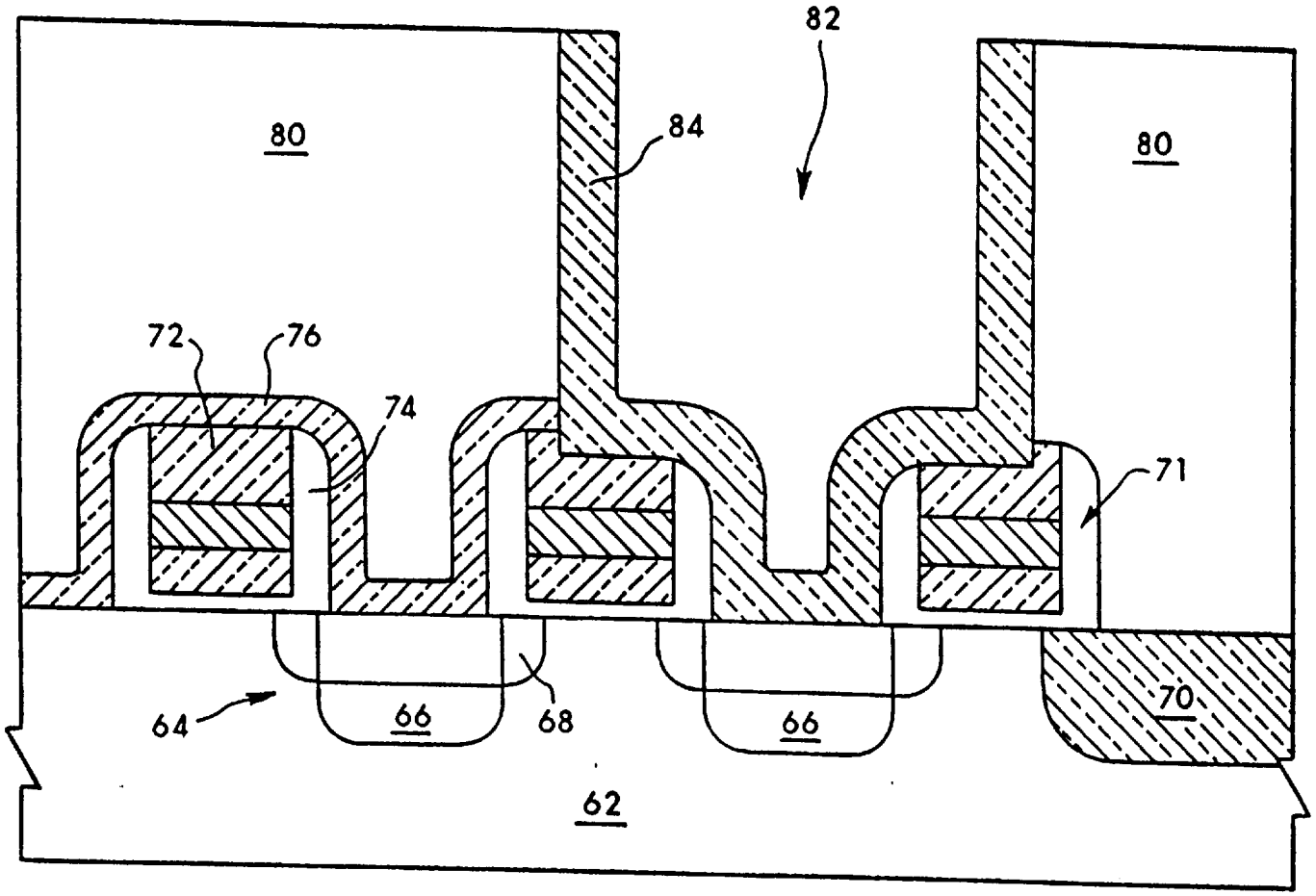
FIG. 15 is a cross-sectional view of an alternative embodiment of the invention at a stage of fabrication comparable to FIG. 5 in which the layer of insulator over the transistor gates, the transistor spacer members, and the etch stop layer are made from nitride, and the storage poly and first BPSG oxide layers have been planarized by a CMP process rather than etched.

Referring now to FIG. 15 a cross-sectional view of an integrated circuit wafer according to an alternative preferred embodiment of the invention just prior to the deposition of the cell dielectric In this embodiment conventional LDD (Lightly Doped Drains) N−/N+ S/D regions 64 and field oxide regions 70 are formed in the lightly P-doped silicon substrate 62. LDD's 64 comprise an N+ doped regions 66 and N-doped regions 68. The NMOS and PMOS transistors are formed as in the embodiment of FIG. 1, except here the insulating layer 72 over gates 71, the spacers 74 and the etch stop layer 76 are all preferably made of silicon nitride ($Si_3N_4$). The insulating layer 80 is again preferably BPSG oxide, and a photo-mask step followed by an oxide etch selective to nitride (fist etch process) and a nitride etch (second etch process) has defined the storage node container 82. Note that these etch steps can now penetrate into the nitride insulators 72 and spacers 74 without contacting the poly1/$WSi_x$ gates 71. Thus this embodiment provides additional margin for the etch stop layer 76. Following the etches, the storage poly 84 is deposited. In this embodiment, instead of etching the storage poly 84, the storage poly 84 and oxide 80 are planarized, isolated in a CMP process. Subsequent steps may be as described above in connection with FIGS. 6–14.

The particular dimensions of the various layers and parts described above can vary widely depending on a wide variety of factors. The nominal size in the preferred embodiment as well as an approximate range for each of the important dimensions, assuming a 64 Mbit DRAM with about a 1.6 $\mu m^2$ cell, are as follows: the field oxide areas 16 and 70 are nominally about 4000 Å thick, and the gate oxide 14 is nominally about 125 Å thick; the height of the arch of the etch stop layer 30, 76 above the substrate 12, 62 is nominally about 6000 Å; the thickness of the oxide layer 32 between the top of the etch stop layer 30 and the bottom of the cell poly 52 is nominally about 3000 Å; the thickness of the storage poly 42, 84 and the cell poly 52 is nominally about 1000 Å for each; the thickness of the cell dielectric 50 is nominally about 80 Å; the depth of the etch of the BPSG oxide 32 below the top of the vertical walls of the storage poly 42 which is the same as the height that the cell poly 52 extends upward along the periphery 48 of the storage container 47 walls above the level of the cell poly 52 in the bit line contact region, is about 6000 Å; the thickness of the oxide layer 58 above the highest point of the cell poly 52 is nominally about 4000 Å. In the horizontal direction in the figures, the width of the transistor gate members 20B, 20C in the array 11 is about 0.4 $\mu$m, the word line spacers 19 are about 0.2 $\mu$m wide, and the gap between the word line spacers 19 which is the same as the width of the bit line contact at the active area 29B is nominally about 0.2 $\mu$m to 0.4 $\mu$m; the width of the transistor gate members, such as 20A at the locations of the metal to poly 1 contacts at the periphery of the array are about 1.2 μm, which is also the nominal width of the word line contact regions 38. The other relevant dimensions all depend on the above dimensions, or are conventional.

A feature of the invention is that it lends itself to making bit line contact regions 36 in which the spacers don't close off the future bit line contact. The bit line region 36 can be etched extra wide because the oxide etch of the upper insulating layer 58 stops on the cell poly 52 which is significantly above the active area 29B, 109A. The etch stop layer 30 also assists because the final etch is selective to oxide.

Another feature of the invention is that the bit line contact region 36 also interacts with the etch stop layer 30 to allow the bit line contact 100 to be self-aligned with the final etch.

A feature of the invention related to the above feature is that the oxide etch after the isolation of the storage nodes 42 is a partial etch, or the etch is eliminated. This partial etch (or no etch) raises the cell poly 52 in the area of the bit line contact 100, above the region of the transistor members 20B, 20C so that the insulating spacers 60, 94 may be located in a relatively spacious area of the device. This raising of the cell poly also permits the elimination of a mask step would other wise be necessary to protect the cell poly in the region of the cell poly contact regions 40 (FIG. 7) and the transistor conductive layers 24, 26 (poly 1) during the formation of the bit line contact regions 36.

Another feature of the invention is that the upper end of the bit line contact region 36 is wider than the lower end. This permits even more space in which to make the upper end of contact 100 which will connect to the metal bit line. This additional space allows a metal contact to be used, either with conventional metal contact technology or utilizing a combination poly plug/metal plug.

A further feature of the invention is that the invention provides a method of utilizing contact-through-cell poly technology to make the bit line contacts and at the same time making the metal to cell poly contacts with no additional photo-mask or etch steps.

A related feature of the invention to the above features is that it provides an overall efficient method of making compact, multi-megabit DRAM with minimal masking steps exploiting significant self alignment and large cell capacitance for a given cell area There has been described a novel process and structure which can be utilized to build more effective contacts utilizing bit-line-contact-through-cell-poly technology in compact and better performing DRAMS and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to fabricate through-cell-poly-contacts to which good metalization connections can be made even in very high pitch DRAMs, other implementations of such a process design and structure become evident. It is also evident that the steps recited may in some instances be performed in a different order. Or equivalent structures and process may be substituted for the various structures and processes described. Or a variety of different dimensions and materials may be used. Additional structures and process steps may be added. Consequently, the invention is to be construed as embracing each and every novel feature and novel combination of features present in and/or possessed by the integrated circuit structure and fabrication process described.

What is claimed is:

1. A method of fabricating a capacitor insulating spacer for a contact that passes through a capacitor cell conducting layer in an integrated circuit DRAM, said method comprising:

providing a semiconducting substrate having an active area formed therein;

providing a plurality of transistor gate members, one on either side of said active area, wherein each transistor gate member has a side that opposes a side of another transistor gate member;

providing a transistor insulating spacer member on each said opposing side of each said transistor gate member;

providing a lower insulating layer covering said transistor gate members, said transistor insulating spacer member, and said active area;

providing a capacitor conducting layer covering said lower insulating layer above said active area;

providing a hard mask layer over said capacitor conducting layer;

utilizing a photo-mask and etch process to define a contact region having Walls penetrating at least said hard mask layer and said capacitor conducting layer above said active area;

creating a cell insulating spacer layer on said walls and said hard mask layer, said cell insulating spacer layer made of a material that etches differently than said hard mask layer; and performing an anisotropic etch of said cell insulating spacer layer to remove said cell insulating spacer layer from said hard mask layer and create a capacitor insulating spacer covering said capacitor conducting layer on said walls of said contact region, said capacitor insulating spacer traveling down said walls of said contact region during said anisotropic etch.

2. A method of fabricating a capacitor insulating spacer as in claim 1 wherein said step of performing an anisotropic etch further comprises etching through said lower insulating layer.

3. A method of fabricating a capacitor insulating spacer as in claim 1 further comprising a step of providing an upper insulating layer between said capacitor conducting layer and said hard mask layer, and said step of utilizing a photo-mask and etch process further comprises utilizing said photo-mask and etch process to penetrate said upper insulating layer.

4. A method of fabricating a capacitor insulating spacer as in claim 1 further comprising the steps of: providing an etch stop layer between said active area and said lower insulating layer;

stopping said anisotropic etch on said etch stop layer; and removing said etch stop layer using said hard mask layer as a mask after said step of performing an anisotropic etch.

5. A method of fabricating a bit line contact that penetrates a capacitor cell plate in a stacked capacitor DRAM comprising the steps of:

providing a semiconductor substrate having a surface and an active area formed therein, first and second transistor gate members formed on said surface of said substrate, each of the first and second transistor gate members having sides extending upward from said surface of said substrate, wherein said first and second transistor gate members are positioned on opposed sides of said active area;

forming transistor insulating spacers covering said sides of said first and said second gate members, wherein a first distance separates said transistor insulating spacer formed on said first transistor gate member from said transistor insulating spacer formed on said second transistor gate member;

forming a lower insulating layer covering said first and second transistor gate members, said first insulating spacers, and said active area, said lower insulating layer being significantly thicker than said first and second transistor gate members;

forming a capacitor cell plate layer covering said lower insulating layer above said active area;

forming an upper insulating layer covering said capacitor cell plate layer;

etching a contact region above said active area penetrating said upper insulating layer and said capacitor cell plate layer above said active area, said contact region having opposed sidewalls that are separated from each other by a second distance that is more than the first distance separating said transistor insulating spacers, wherein said etching exposes a portion of said capacitor cell plate layer in said opposed sidewalls;

creating a third insulating layer on said wafer covering said opposed sidewalls including said exposed portion of said capacitor cell plate;

performing an anisotropic etch of said third insulating layer and said lower insulating layer to expose said active area at said semiconductor substrate surface while forming a capacitor insulating spacer on said opposed sidewalls of said contact region covering said exposed portions of said capacitor cell plate layer, wherein said anisotropic etch defines an opening between said capacitor insulating spacer on said opposing sidewalls at least as large as said first distance; and forming a bit line contact in said contact region making direct electrical contact to said active area and extending fully the first distance between the transistor insulating spacers.

6. A method of fabricating a bit line contact as in claim 5 and further including the step of creating an etch stop layer covering said upper insulating layer, and wherein said step of etching a contact region further comprises etching said contact region penetrating said etch stop layer.

7. A method of fabricating a bit line contact as in claim 6 wherein said step of etching said contact region and said step of creating a third insulating layer on said wafer comprises:

etching said contact region penetrating said etch stop layer, said upper insulating layer, and said capacitor cell plate layer above said active area;

creating said third insulating layer on said wafer, said third insulating layer made of a material that etches similarly to said lower insulating layer; and using said etch stop layer as a mask during said anisotropic etch step.

8. A method of fabricating a capacitor insulating spacer for a contact that passes through a capacitor cell conducting layer in an integrated circuit DRAM, said method comprising:

providing a semiconducting substrate having an active area;

providing first and second transistor gate members one on either side of said active area, wherein said first and second transistor gate members are positioned so that a side of said first transistor gate member opposes a side of said second transistor gate member;

providing transistor insulating spacer members on said opposing side of each of said first and said second transistor gate members, wherein an opening between said transistor insulating spacer members has a first width;

providing a lower insulating layer covering said transistor gate members, said transistor insulating spacer member, and said active area;

providing a capacitor conducting layer covering said lower insulating layer above said active area;

providing an upper insulating layer covering said capacitor conducting layer;

creating an upper etch stop layer covering said upper insulating layer;

utilizing a photo-mask and etch process to define a contact region penetrating said upper etch stop layer, said upper insulating layer, and said capacitor conducting layer above said active area, wherein said contact region has a pair of opposing walls;

creating a third insulating layer covering said pair of opposing walls, said third insulating layer made of a material that etches similarly to said lower insulating layer; and performing an anisotropic etch of said third insulating layer and said lower insulating layer to expose said active area fully the first width between the transistor insulating spacers while leaving a capacitor insulating spacer covering said capacitor conducting layer on said opposing walls of said contact region, said upper etch stop layer serving as a mask during said anisotropic etch step.

9. A method as in claim 8 wherein said contact region is sufficiently wide so that an opening between opposing sides of said capacitor insulating spacer has a second width that is at least as great as said first width defined by said opening between said opposing sides of said transistor insulating spacer members.

10. A method as in claim 8 further comprising the steps of: providing an active area etch stop layer between said lower insulating layer and said transistor gate members, said transistor insulating spacer members, and said active area; and said step of performing an anisotropic etch comprises etching said third insulating layer and lower insulating layer with a first anisotropic etch process and then etching said active area etch stop layer with a second anisotropic etch process.

11. A method as in claim 10 wherein said capacitor spacer member is self aligned with said transistor gate members.

12. A method as in claim 10 wherein said upper etch stop layer is made of poly silicon and said active area etch stop layer is made of aluminum oxide.

13. A method as in claim 10 wherein said upper etch stop layer and said active area etch stop layer are made of silicon nitride.

14. A method of fabricating a bit line contact that penetrates the capacitor cell plate in a stacked capacitor DRAM comprising the steps of:

providing a semiconductor wafer, said semiconductor wafer including a semiconducting substrate having an active area; a plurality of transistor gate members formed on said substrate, each said transistor gate member having a side that opposes a side of an adjacent transistor gate member, wherein one transistor gate member is positioned on either side of said active area; transistor insulating spacers formed on each said opposing side of each of said transistor gate members, wherein each of said transistor insulating spacers opposes another of said transistor insulating spacers formed on an adjacent transistor gate member; a lower insulating layer covering said transistor gate members, said transistor insulating spacer member, and said active area; a capacitor cell plate layer covering said lower insulating layer above said active area; and an upper insulating layer covering said capacitor cell plate layer;

utilizing a photomask and an etch process to define a contact region having sides penetrating said upper insulating layer, said capacitor cell plate layer, and said lower insulating layer above said active area, said contact region being wider than the distance between said opposing transistor spacer members;

creating a third insulating layer extending laterally from the sides of said contact region sufficiently far to overhang said sides of each of said transistor gate members;

performing an anisotropic etch of said third insulating layer to expose said active area at a surface of said semiconductor substrate extending fully between said opposing transistor insulating spacers while forming a capacitor insulating spacer member on said sides of said contact region covering said capacitor cell plate layer on the sides of said contact region, wherein an opening between opposing sides of said capacitor spacer member is as wide or wider than a width between said opposing transistor spacer members; and forming a bit line contact in said contact region extending fully between said opposing transistor insulating spacers.

15. A method of fabricating a bit line contact as claim 14 and further including the step of creating an upper etch stop layer covering said upper insulating layer, wherein said step of utilizing further comprises utilizing said photo-mask and said etch process to define said contact region penetrating said upper etch stop layer.

16. A method of fabricating a bit line contact as in claim 15 wherein said step of utilizing a photo-mask and etch process to define a contact region and said step of creating a third insulating layer on said wafer comprise:

utilizing said photo-mask process to define said contact region having sides penetrating said upper etch stop layer, said upper insulating layer, and said capacitor cell plate layer above said active area;

creating said third insulating layer on said wafer, said third insulating layer made of a material that etches similarly to said lower insulating layer; and performing an anisotropic etch of said third insulating layer and said lower insulating layer to expose said active area while leaving said capacitor insulating spacer covering said capacitor conducting layer on the walls of said contact region, said upper insulating area etch stop layer serving as a mask for the anisotropic etch step.

*17. A method of fabricating a capacitor insulating spacer for a contact that passes through a capacitor cell conducting layer in an integrated circuit DRAM, wherein said integrated circuit DRAM comprises a semiconducting substrate having an active area, a plurality of transistor gate members, one on either side of said active area, a lower insulating layer covering said transistor gate members and said active area, a capacitor conducting layer covering said lower insulating layer above said active area, and a hard mask layer over said capacitor conducting layer, said method comprising:*

*etching a contact region having walls penetrating at least said hard mask layer and said capacitor conducting layer above said active area;*

*forming a cell insulating spacer layer on said walls and said hard mask layer; and*

*anisotropically etching said cell insulating spacer layer to remove said cell insulating spacer layer from said hard mask layer and create a capacitor insulating spacer covering said capacitor conducting layer on said walls of said contact region, said capacitor insulating spacer traveling down said walls of said contact region during said anisotropically etch.*

*18. The method of claim 17 wherein said step of anisotropic etching further comprises etching through said lower insulating layer.*

*19. A method of claim 17 further comprising providing an upper insulating layer between said capacitor conducting layer and said hard mask layer, and said step of etching said contact region further comprises penetrating said upper insulating layer.*

*20. The method of claim 17, further comprising:*

*providing an etch stop layer between said active area and said lower insulating layer;*

*stopping said anisotropic etch on said etch stop layer; and*

*removing said etch stop layer using said hard mask layer as a mask after said anisotropic etch.*

*21. A method of fabricating a bit line contact that penetrates a capacitor cell plate in a stacked capacitor DRAM comprising a semiconductor substrate having an active area, first and second transistor gate members positioned on opposed sides of said active area, transistor insulating spacers covering said sides of said first and said second gate members, wherein a first distance separates said transistor insulating spacer formed on said first transistor gate member from said transistor insulating spacer formed on said second transistor gate member, a lower insulating layer covering said first and second transistor gate members, said first insulating spacers, and said active area, a capacitor cell plate layer covering said lower insulating layer above said active area, and an upper insulating layer covering said capacitor cell plate layer, said method comprising the steps of:*

*etching a contact region above said active area penetrating said upper insulating layer and said capacitor cell plate layer above said active area, said contact region having opposed sidewalls that are separated from each other by a second distance that is more than the first distance separating said transistor insulating spacers, wherein said etching exposes a portion of said capacitor cell plate layer in said opposed sidewalls;*

*forming a third insulating layer on said wafer covering said opposed sidewalls including said exposed portion of said capacitor cell plate;*

*anisotropically etching said third insulating layer and said lower insulating layer to expose said active area at said semiconductor substrate surface while forming a capacitor insulating spacer on said opposed sidewalls of said contact region covering said exposed portions of said capacitor cell plate layer, wherein said anisotropic etch defines an opening between said capacitor insulating spacer on said opposing sidewalls at least as large as said first distance; and*

*forming a bit line contact in said contact region making direct electrical contact to said active area and extending fully the first distance between the transistor insulating spacers.*

*22. The method of claim 21, further including forming an etch stop layer covering said upper insulating layer, and wherein said etching a contact region further comprises etching said contact region penetrating said etch stop layer.*

*23. The method of claim 22 wherein said etching said contact region and said forming a third insulating layer on said wafer comprises:*

*etching said contact region penetrating said etch stop layer, said upper insulating layer, and said capacitor cell plate layer above said active area;*

*forming said third insulating layer on said wafer, said third insulating layer made of a material that etches similarly to said lower insulating layer; and*

*using said etch stop layer as a mask during said anisotropic etch step.*

*24. A method of fabricating a capacitor insulating spacer for a contact that passes through a capacitor cell conducting layer in an integrated circuit DRAM comprising a semiconducting substrate having an active area, first and second transistor gate members, one on either side of said active area, wherein said first and second transistor gate members are positioned so that a side of said first transistor gate member opposes a side of said second transistor gate member, transistor insulating spacer members on said opposing side of each of said first and said second transistor gate members, wherein an opening between said transistor insulating spacer members has a first width, a lower insulating layer covering said transistor gate members, said transistor insulating spacer member, and said active area, a capacitor conducting layer covering said lower insulating layer above said active area, an upper insulating layer covering said capacitor conducting layer, and an upper etch stop layer covering said upper insulating layer, said method comprising:*

*etching a contact region penetrating said upper etch stop layer, said upper insulating layer, and said capacitor conducting layer above said active area, wherein said contact region has a pair of opposing walls;*

*forming a third insulating layer covering said pair of opposing walls; and*

*anisotropically etching said third insulating layer and said lower insulating layer to fully expose said active area the first width between the transistor insulating spacers while leaving a capacitor insulating spacer covering said capacitor conducting layer on said opposing walls of said contact region, said upper etch stop layer serving as a mask during said anisotropic etch.*

*25. The method of claim 24, wherein said contact region is sufficiently wide so that an opening between opposing sides of said capacitor insulating spacer has a second width that is at least as great as said first width defined by said opening between said opposing sides of said transistor insulating spacer members.*

*26. The method of claim 24 further comprising providing an active area etch stop layer between said lower insulating layer and said transistor gate members, said transistor insulating spacer members, and said active area; and said anisotropic etch comprises etching said third insulating layer and lower insulating layer with a first anisotropic etch process and then etching said active area etch stop layer with a second anisotropic etch process.*

*27. The method of claim 26 wherein said capacitor spacer member is self aligned with said transistor gate members.*

*28. A method of fabricating a bit line contact that penetrates the capacitor cell plate in a stacked capacitor DRAM, said stacked capacitor comprising a semiconducting substrate having an active area and a plurality of transistor gate members, each said transistor gate member having a side that opposes a side of an adjacent transistor gate member, wherein one transistor gate member is positioned on either side of said active area, transistor insulating spacers formed on each said opposing side of each of said transistor gate members, wherein each of said transistor insulating spacers opposes another of said transistor insulating spacers formed on an adjacent transistor gate member, a lower insulating layer covering said transistor gate members, said transistor insulating spacer member, and said active area, a capacitor cell plate layer covering said lower insulating layer above said active area, and an upper insulating layer covering said capacitor cell plate layer, said method comprising the steps of:*

*etching a contact region having sides penetrating said upper insulating layer, said capacitor cell plate layer, and said lower insulating layer above said active area, said contact region being wider than the distance between said opposing transistor spacer members;*

*forming a third insulating layer extending laterally from the sides of said contact region sufficiently far to overhang said sides of each of said transistor gate members;*

*anisotropically etching said third insulating layer to fully expose said active area at a surface of said semiconductor substrate extending between said opposing transistor insulating spacers while forming a capacitor insulating spacer member on said sides of said contact region covering said capacitor cell plate layer on the sides of said contact region, wherein an opening between opposing sides of said capacitor spacer member is at least as wide as a width between said opposing transistor spacer members: and*

*forming a bit line contact in said contact region extending fully between said opposing transistor insulating spacers.*

*29. The method of claim 28 further including forming an upper etch stop layer covering said upper insulating layer, wherein etching said contact region penetrates said upper etch stop layer.*

*30. The method of claim 29, wherein etching said contact region and forming said third insulating layer comprise:*

*etching said contact region having sides penetrating said upper etch stop layer, said upper insulating layer, and said capacitor cell plate layer above said active area;*

*forming said third insulating layer with a material that etches similarly to said lower insulating layer; and*

*anisotropic etching said third insulating layer and said lower insulating layer to expose said active area while leaving said capacitor insulating spacer covering said capacitor conducting layer on the walls of said contact region said upper insulating area etch stop layer serving as a mask for the anisotropic etch.*

*31. An integrated circuit DRAM, comprising*

*a semiconducting substrate having an active area;*

*first and second transistor gate members one on either side of said active area wherein said first and second transistor gate members are positioned so that a side of said first transistor gate member opposes a side of said second transistor gate member;*

*transistor insulating spacer members on said opposing side of each of said first and said second transistor gate members, wherein an opening between said transistor insulating spacer members has a first width;*

*a lower insulating layer covering a portion of said transistor gate members;*

*a capacitor conducting layer covering said lower insulating layer;*

*an upper insulating layer covering said capacitor conducting layer;*

*an upper etch stop layer covering said upper insulating layer;*

*a first contact via extending through said upper etch stop layer said upper insulating layer, and said capacitor conducting layer above said active area, wherein said first contact via has a pair of opposing walls which are spaced wider than said first width;*

*a second contact via extending through said lower insulating layer to fully expose said active area across the first width between the transistor insulating spacers; and*

*capacitor insulating spacers covering said capacitor conducting layer on said opposing walls of said first contact via.*

*32. A method of forming a tapered via in a semiconductor device comprising:*

*forming a patterned mask on said semiconductor device;*

*etching said semiconductor device a predetermined distance forming a first via having sidewalls and a bottom;*

*forming a insulating buffer layer over said patterned mask and said first via sidewalls and bottom; and*

*etching said insulating buffer layer and said semiconductor device such that a portion of said insulating buffer layer on said first via bottom is removed before a portion of said insulating buffer layer on said via sidewalls is removed, thereby forming a second via below said first via which is narrower than said first via.*

*33. The method of claim 32 wherein said semiconductor device comprises an insulative layer above an active substrate.*

*34. The method of claim 33 wherein said etching of said first via comprises etching a predetermined distance into said insulative layer; and wherein said etching of said second via extends said second via to said active substrate.*

*35. The method of claim 33 wherein said insulative layer comprises a first insulative layer and a second insulative layer with a capacitor structure between said first insulative layer and said second insulative layer.*

*36. The method of claim 35 wherein said etching of said first via includes etching through said capacitor structure.*

*37. The method of claim 36 wherein in a portion of said insulating buffer layer on said first via remains and covers a portion of said capacitor structure on said first via after said etching of said second via.*

*38. The method of claim 33 wherein an etch stop layer is disposed between said insulative layer and said active substrate.*

*39. The method of claim 34 wherein said etching of said second via stops at said etch stop layer.*

*40. The method of claim 39 further comprise etching said etch stop layer to expose said active substrate.*

*41. A tapered via in a semiconductor device formed by a method comprising:*

*forming a patterned mask on said semiconductor device;*

*etching said semiconductor device a predetermined distance forming a first via having sidewalls and a bottom;*

*forming an insulating buffer layer over said patterned mask and said first via sidewalls and bottom; and*

*etching said insulating buffer layer and said semiconductor device such that a portion of said insulating buffer layer on said first via bottom is removed before a portion of said insulating buffer layer on said via sidewalls is removed, thereby forming a second via below said first via which is narrower than said first via.*

* * * * *